(12) United States Patent
Takeuchi et al.

(10) Patent No.: US 6,333,681 B1
(45) Date of Patent: Dec. 25, 2001

(54) PIEZOELECTRIC/ELECTROSTRICTIVE DEVICE

(75) Inventors: Yukihisa Takeuchi, Aichi; Tsutomu Nanataki, Toyoake; Masato Komazawa; Koji Kimura, both of Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/491,171

(22) Filed: Jan. 25, 2000

(30) Foreign Application Priority Data

| Oct. 1, 1999 | (JP) | 11-281522 |
| Oct. 28, 1999 | (JP) | 11-307844 |
| Jan. 21, 2000 | (JP) | 12-013576 |

(51) Int. Cl.[7] .................................................. H01L 41/08
(52) U.S. Cl. .......................... 331/314; 310/328; 310/330
(58) Field of Search ................................... 310/321, 328, 310/330, 331, 332

(56) References Cited

U.S. PATENT DOCUMENTS 6,109,104 * 8/2000 Fukuda et al. ..................... 73/504.13
6,140,739 * 10/2000 Arai et al. ............................ 310/321

FOREIGN PATENT DOCUMENTS 63-64640   3/1988   (JP) .
10-136665  5/1998   (JP) .

OTHER PUBLICATIONS

Yoshikazu Soeno, et al., "Piezoelectric Piggy–Back Microactuator for Hard Disk Drive," IEEE Transactions on Magnetics, vol. 35, No. 2, Mar. 1999, pp. 983–987.

S. Koganezawa, et al., "Dual–Stage Actuator System for Magnetic Disk Drives Using a Shear Mode Piezoelectric Microactuator," IEEE Transactions on Magnetics, vol. 35, No. 2, Mar. 1999, pp. 998–992.

* cited by examiner

Primary Examiner—Mark O. Budd
(74) Attorney, Agent, or Firm—Burr & Brown

(57) ABSTRACT

A piezoelectric/electrostrictive device is disclosed comprising a driving portion to be driven by a displacement of a piezoelectric/electrostrictive element, a movable portion to be operated by a drive of the driving portion, a fixing portion for holding the driving portion and the movable portion, the movable portion being coupled with the fixing portion via the driving portion, and a hole formed by inner walls of the driving portion, an inner wall of the movable portion, and an inner wall of the fixing portion. The driving portion comprises a pair of mutually opposing thin plate portions, and a piezoelectric/electrostrictive element including a piezoelectric/electrostrictive operating portion comprising at least a pair or more of electrodes and a piezoelectric/electrostrictive layer formed on at least a part of the outer surface of at least one thin plate portion out of the thin plate portions, one end of the piezoelectric/electrostrictive operating portion in a direction in which the fixing portion is connected with the movable portion exists on the fixing portion or the movable portion, and the other end of the piezoelectric/electrostrictive operating portion is arranged on the thin plate portion, and at least a piezoelectric/electrostrictive layer of the piezoelectric/electrostrictive element exists extending over the movable portion and the fixing portion. The device of the present invention, having high rigidity in the width direction of the thin plate portions, namely in the Y-axis direction, enables rigid joining when functional parts such as sensors, magnetic heads, or the like are fixed to the present device, and further when the present device per se is fixed to another structure.

10 Claims, 15 Drawing Sheets

CERAMIC GREEN SHEET 2 FOR THIN PLATE

CERAMIC GREEN SHEET 4
HAVING A HOLE FORMED THEREON

CERAMIC GREEN SHEET 3
HAVING A HOLE FORMED THEREON

CERAMIC GREEN SHEET 2
HAVING A HOLE FORMED THEREON

CERAMIC GREEN SHEET 1
HAVING A HOLE FORMED THEREON

CERAMIC GREEN SHEET 1 FOR THIN PLATE

PIEZOELECTRIC/ELECTROSTRICTIVE DEVICE

BACKGROUND OF THE INVENTION AND RELATED ART STATEMENT

The present invention relates to a piezoelectric/electrostrictive device comprising a movable portion to be operated by displacement of a piezoelectric/electrostrictive element, or a piezoelectric/electrostrictive device capable of detecting displacement of a movable portion by a piezoelectric/electrostrictive element, and more particularly relates to a piezoelectric/electrostrictive device which is superior in mechanical strength, impact resistance, and humidity resistance, and is capable of having the movable portion efficiently operated in large magnitude.

In recent years, in the fields of optics and magnetic recording, precision machining, and the like, a displacement element capable of adjusting an optical path length or position in sub-micron order has been required, and development has been progressed of a displacement element utilizing a displacement due to the inverse piezoelectric effect or the electrostrictive effect caused when a voltage is applied on a piezoelectric/electrostrictive material (for example, a ferroelectric substance, or the like). For example, as shown in FIG. 18, a piezoelectric actuator 21, in which, by providing a hole 28 on a plate-like body composed of a piezoelectric/electrostrictive material, a fixing portion 25, a movable portion 24, and a beam 26 connecting therewith are integrally formed, and an electrode layer 22 is further provided on the beam 26, is disclosed in JP-A-10-136665.

In the actuator 21, when a voltage is applied across the electrode layer 22, the beam 26 expands or contracts in a direction in which the fixing portion 25 is connected with the movable portion 24 by the inverse piezoelectric effect or the electrostrictive effect, thus enabling the movable portion 24 to displace in an arc-shaped mode or a rotational mode in the plane of the plate-like body. On the other hand, JP-A-63-64640 discloses a technique with regard to an actuator utilizing a bimorph, wherein an electrode of the bimorph is split to be provided thereon, and the actuator is driven by selecting the split electrodes to perform precise positioning at a high speed, and for example, a structure in which two bimorphs are used mutually opposing is shown in FIG. 4 of the specification thereof.

However, with the actuator 21, as a displacement in the expansion/contraction direction (namely, the in-plane direction of the plate-like body) of the piezoelectric/electrostrictive material is transmitted per se to the movable portion, there is a problem that an operational quantity of the movable portion 24 is small.

Further, the actuator 21, having all members thereof composed of a piezoelectric/electrostrictive material, which is fragile and relatively heavy in weight, has further problems, in addition to the mechanical strength being low, and being inferior in handling property, impact resistance, and humidity resistance, in that the actuator 21 per se is heavy and is likely to be influenced by harmful vibrations (for example, residual vibrations or noise vibrations when operated at a high speed) in operation. In order to solve the above-described problems of the actuator 21, a proposition is made that the hole 28 is filled with a filler having flexibility. However, it is apparent that the efficiency of the displacement due to the inverse piezoelectric effect or the electrostrictive effect is decreased, when the filler is used.

On the other hand, what is shown in FIG. 4 of JP-A-63-64640 is that, in joining an intermediary member 3 with a bimorph, a portion having no divided electrode is joined with the intermediary member, and at the joined portion, only a bimorph portion unable to utilize an effect of the divided electrode, namely a bimorph portion which is not a displacement generator is joined. On the other hand, the joining at a joined portion of a head with a bimorph is in the similar joining mode. As the result, the bending displacement of the bimorph is developed toward the inner space between the intermediary member and the head, and it is a structure where an action for effectively displacing the head per se toward the outer space is unable to be obtained. In addition, the actuator disclosed in JP-A-63-64640 is so structured that a displacement generating member and a so-called frame member (intermediary member or the like) are separately prepared, and then adhered together to be incorporated, and consequently it is a structure where the joined state of the frame with the bimorph is likely to vary with time, and also drifting of a displacement, exfoliation, or the like is likely to be caused. Further, the structure having an adhesive intervened at the joined portion of a bimorph with an intermediary member and at the joined portion of a head with the bimorph, namely at a holding portion for a displacement member is also a structure where rigidity of the holding portion per se is low and it is difficult to obtain a higher resonant frequency which is required in high speed operation.

Although the present applicants have, of course, proposed a piezoelectric/electrostrictive device capable of solving such problems in the specification of the Japanese Patent Application No. 11-375581 and the like, development of a piezoelectric/electrostrictive device capable of obtaining still larger displacement quantity as well as capable of high speed response has been sought after as a precise positioning mechanism in the optical and magnetic recording fields.

The present invention is made in view of such current situation, and an object thereof is to provide a displacement element which is capable of increasing mechanical rigidity of joined portions of the thin plate portions with the movable portion and the thin plate portions with the fixing portion, facilitating higher resonant frequency, and further increasing displacement quantity of the movable portion, and a sensor element capable of efficiently detecting vibrations of the movable portion in higher precision.

SUMMARY OF THE INVENTION

According to the present invention, firstly provided is a piezoelectric/electrostrictive device comprising a driving portion to be driven by a displacement of a piezoelectric/electrostrictive element, a movable portion to be operated by a drive of the driving portion, a fixing portion for holding the driving portion and the movable portion, the movable portion being coupled with the fixing portion via the driving portion, and a hole formed by inner walls of the driving portion, an inner wall of the movable portion, and an inner wall of the fixing portion; the piezoelectric/electrostrictive device being characterized in that the driving portion comprises a pair of mutually opposing thin plate portions and a piezoelectric/electrostrictive element including a piezoelectric/electrostrictive operating portion comprising a pair or more of electrodes and a piezoelectric/electrostrictive layer formed at least on a part of the outer surface of at least one thin plate portion of the pair of thin plate portions, one end of the piezoelectric/electrostrictive operating portion in a direction in which the fixing portion is connected with the movable portion exists on the fixing portion or the movable portion, the other end of the piezoelectric/electrostrictive operating portion is arranged on the thin plate portion, and at least the piezoelectric/electrostrictive layer of the piezoelectric/electrostrictive element exists extended over the movable portion and the fixing portion.

Here, the movable portion, the thin plate portions, and the fixing portion may be comprised of ceramics or a metal, further respective members may be comprised of the same ceramic material, or of different materials of a metal or ceramics.

Further, the present invention provides a piezoelectric/electrostrictive device characterized in that the movable portion, the thin plate portions, and the fixing portion are integrally formed by co-firing a ceramic green sheet laminate, a piezoelectric/electrostrictive device characterized in that the piezoelectric/electrostrictive element has a film-like piezoelectric/electrostrictive element directly formed on the thin plate portion and the movable portion or the fixing portion, and is integrally formed therewith by sintering, a piezoelectric/electrostrictive device characterized in that a piezoelectric/electrostrictive layer constituting the film-like piezoelectric/electrostrictive element in which glass frit is not contained of, a piezoelectric/electrostrictive device characterized in that the length L of the piezoelectric/electrostrictive operating portion disposed on the thin plate portion in the piezoelectric/electrostrictive element constituting the driving portion, together with the length e of the thin plate portion, satisfies the following expression, namely;

$$L=(50\pm40)\times e/100,$$

a piezoelectric/electrostrictive device characterized in that the length L of the piezoelectric/electrostrictive operating portion disposed on the thin plate portion in the piezoelectric/electrostrictive element constituting the driving portion, together with the length e of the thin plate portion, satisfies the following expression, namely;

$$L=(50\pm25)\times e/100,$$

and a piezoelectric/electrostrictive device characterized in that at least one piezoelectric/electrostrictive element out of piezoelectric/electrostrictive elements provided on the outer surface of a pair of mutually opposing thin plate portions has a multi-layered piezoelectric/electrostrictive operating portion.

Further, a piezoelectric/electrostrictive device of the present invention preferably comprises the movable portion, the thin plate portions, and the fixing portion, integrally formed in ceramics, more preferably comprises the movable portion, the thin plate portions, and the fixing portion composed of a material containing filly-stabilized zirconia as the major component, or a material containing partially-stabilized zirconia as the major component, and most preferably comprises at least the movable portion, the thin plate portions, and the fixing portion in a sintered ceramic green laminate. The reason is that joined portions with the movable portion, the thin plate portions, and the fixing portion can be structured to be without boundary by sintering integration, thus not only reliability at the portions can be raised, but also a phenomenon such as drifting or the like as variation with time of a device can be suppressed to be minimum, and a high displacement in a high speed can be developed with improved reproducibility. On the other hand, when composed of a metallic material as described previously, a device superior in handling property and impact resistance can be provided.

It should be noted, however, in fabricating a device according to the present invention, as to be described hereinafter, in addition to a device having all members thereof integrated by sintering, a device can also be obtained by a method wherein a laminate divided in a mutually opposing direction of the thin plate portion, namely a ceramic laminate comprising one thin plate portion and a member to be a fixing portion and a movable portion both in rectangular-solid shape is prepared, a piezoelectric/electrostrictive element is formed by the screen printing on a predetermined position as described previously for the thin plate portions, movable portion, and fixing portion of the ceramic laminate, at least two sintered structures integrally formed by sintering the piezoelectric/electrostrictive element with the above-described ceramic laminate are prepared, and the sintered structures are bonded together so as to have each of the thin plate portions mutually away, namely so as to have respective members to be a fixing portion and a movable portion mutually bonded by way of an adhesive or the like such as glass, an organic resin, or the like. However, the device fabricated first by having a movable portion, thin plate portions, and a fixing portion integrated by co-firing, then by forming a piezoelectric/electrostrictive element film on the sintered body, and then by having the body further sintered to be integrated, is superior in stability and reliability even if a stress is applied to the device by operation of the driving portion, as the device is not provided with a joined portion where the third party intervenes, or a so-called discontinuous portion of a structure, and this is preferable.

Further, a piezoelectric/electrostrictive device of the present invention preferably has a piezoelectric/electrostrictive layer, constituting a piezoelectric/electrostrictive element, composed of a material containing lead zirconate, lead titanate, and lead magnesium niobate as the major component, and a material containing sodium bismuth titanate as the major component is also preferable. Details of materials to be used are to be described later.

In the present specification, "piezoelectric/electrostrictive device" (hereinafter simply referred to as "device") is a notion implying an element for mutually converting electrical energy to mechanical energy via a piezoelectric/electrostrictive material. Accordingly, the piezoelectric/electrostrictive device is preferably used as an active element of a variety of actuators, vibrators, or the like, and specifically as a displacement element utilizing a displacement due to the inverse piezoelectric effect or the electrostrictive effect; and additionally a passive element of an acceleration sensor element, impact sensor element, or the like. Further, a piezoelectric/electrostrictive element means an element comprising a pair or more of electrodes and a piezoelectric/electrostrictive layer, being driven based on a signal to be transmitted, and performing a function for transmitting the movement thereof to a movable portion. In the element, a piezoelectric/electrostrictive operating portion means a portion for generating a predetermined strain according to a given signal, and substantially functioning in a piezoelectric/electrostrictive element, and comprises a portion where a pair or more of electrodes and a piezoelectric/electrostrictive layer are mutually superposed. Furthermore, to have a piezoelectric/electrostrictive operating portion in multi-layers means that a plurality of piezoelectric/electrostrictive operating portions are arranged in a layered mode in a direction perpendicular to the main surface of the thin plate portion, namely in the thickness direction of the thin plate portion. Further, respective electrodes constituting respective piezoelectric/electrostrictive operating portions may have a mode shared among operating portions, or a mode to be commonly used, or an independent mode. To the respective electrodes constituting respective operating portions, a predetermined signal is transmitted to activate an electric field on piezoelectric/electrostrictive layers constituting respective operating portions.

In the present invention, film-like means, to be described later, what is formed by a thick-film or a thin-film formation method, and ordinarily is differentiated from that formed by affixing a piezoelectric/electrostrictive element comprising a piezoelectric plate by an organic resin based adhesive. Further, "piezoelectric" is meant herein by "piezoelectric and/or electrostrictive". Furthermore, "length" means a distance in a direction in which the movable portion is connected with the fixing portion, namely in the Z-axis direction in the drawings, "width" means a distance in a direction penetrating through the hole, namely in the Y-axis direction in the drawings, and "thickness" means a distance in laminating direction of a piezoelectric/electrostrictive element and the thin plate portion, namely in the X-axis direction in the drawings. It should be noted that those having the same or similar function in the drawings are marked, in principle, by the same symbol.

BEST MODE OF CARRYING OUT THE INVENTION

Figure 1:
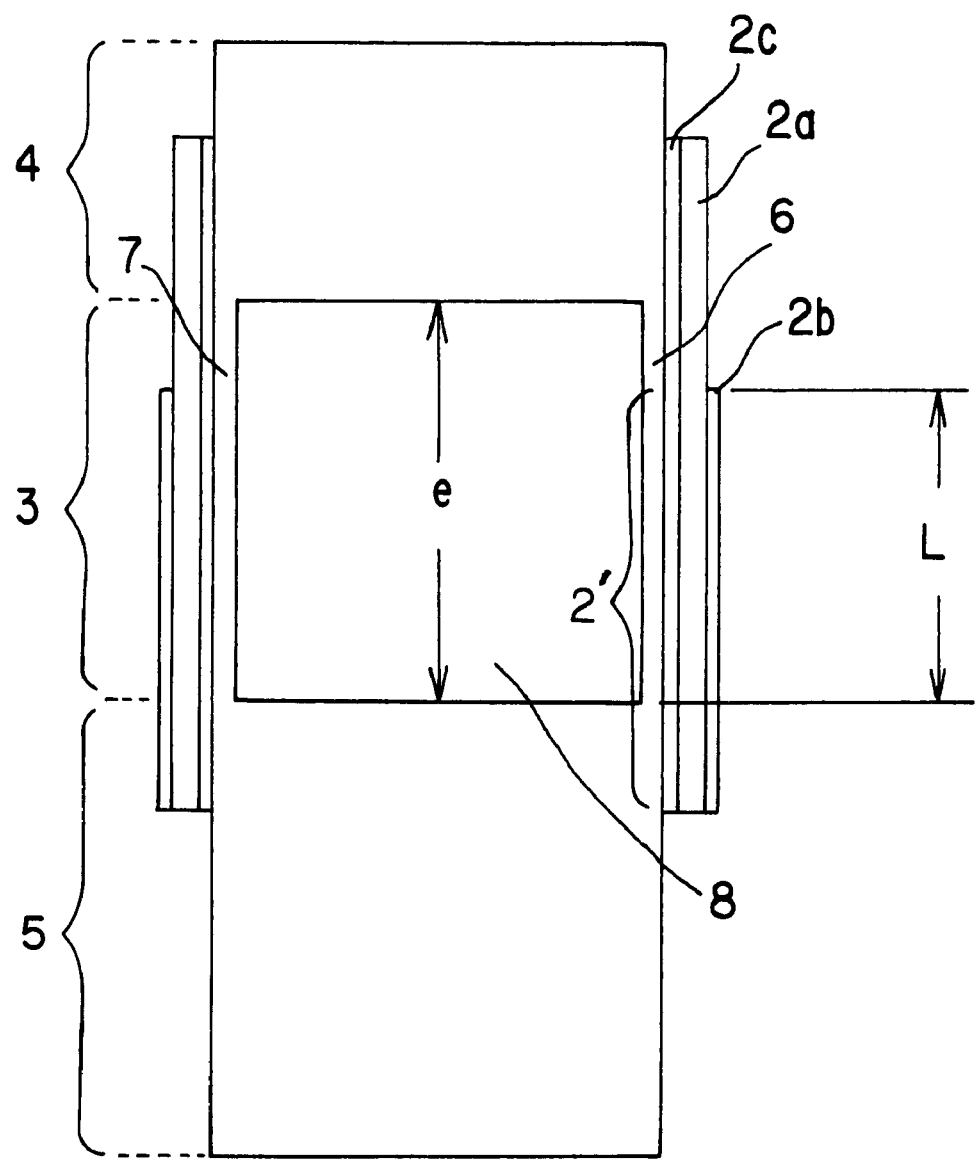
FIG. 1 shows an exemplary view for describing a relationship between the length "L" of a piezoelectric/electrostrictive operating portion disposed on a thin plate portion and the length "e" of the thin plate portion in a piezoelectric/electrostrictive device of the present invention.

A piezoelectric/electrostrictive device of the present invention is hereinafter described with reference to drawings. However, the present invention is not limited to embodiments shown in the drawings.

In FIG. 1, out of a pair of electrodes 2$b$ and 2$c$ and a piezoelectric/electrostrictive layer 2$a$, constituting the piezoelectric/electrostrictive element 2, which are constituting elements capable of holding joining strength of a movable portion 4 with thin plate portions 6 and 7 even when the movable portion 4 is repeatedly displaced in large magnitude, at least the piezoelectric/electrostrictive layer 2$a$ is arranged, extended from the fixing portion 5 side on to the movable portion 4, in a direction in which the fixing portion 5 is connected with the movable portion 4. FIG. 1 further shows an exemplary view, in regard to a piezoelectric/electrostrictive operating portion 2' which is important as one of mechanisms in transmitting to the movable portion 4, an instruction for making a larger displacement, for describing a relationship between the lengths "L" of the piezoelectric/electrostrictive operating portions 2' disposed on thin plate portions 6 and 7 and the lengths "e" of the thin plate portions 6 and 7 so as to have one ends of the piezoelectric/electrostrictive operating portions 2' in a direction in which the fixing portion 5 is connected with the movable portion 4 to exist on the fixing portion 5 or the movable portion 4, and the other ends of the piezoelectric/electrostrictive operating portions 2' arranged on the thin plate portions 6 and 7, and by arranging these members such that a relationship between the length L of piezoelectric/electrostrictive operating portions 2' disposed on the thin plate portions 6 and 7 out of the piezoelectric/electrostrictive operating portions 2' and the length e the thin plate portions 6 and 7 satisfies the following expression, namely;

$$L=(50\pm40)\times e/100,$$

preferably the following expression, namely;

$$L=(50\pm25)\times e/100,$$

the movable portion 4 can be made to largely displace, while holding mechanical strength at joined points of the movable portion 4 with the thin plate portions 6 and 7 above a certain level.

1. Embodiment of the Device

Figure 2:
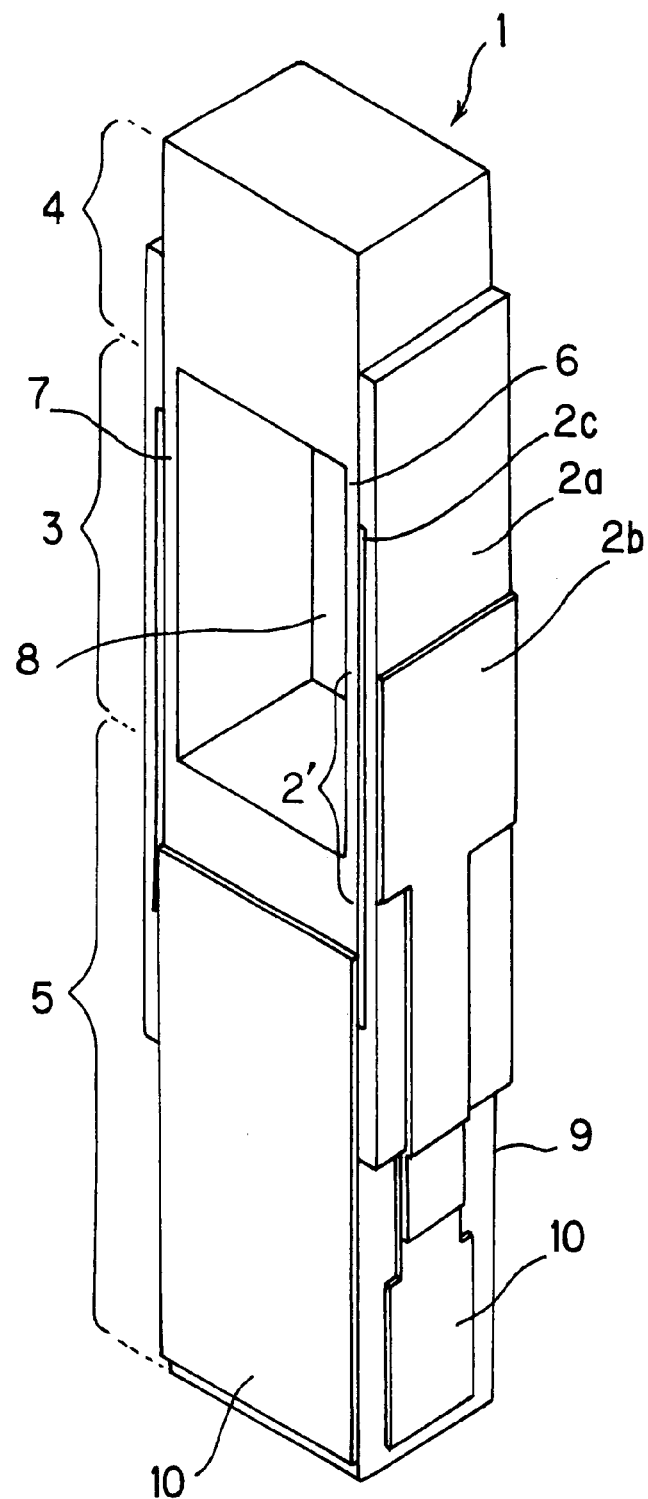
FIG. 2 shows a schematic perspective view of another embodiment of a piezoelectric/electrostrictive device of the present invention.

Now, this invention is described more in detail, with regard to a representative example of a device according to the present invention, firstly with reference to FIG. 2 showing schematic perspective view of an embodiment of a device of the first aspect of the present invention. In an embodiment shown in FIG. 2, a piezoelectric/electrostrictive layer 2a is arranged, in a direction in which the fixing position 5 is connected with the movable portion 4, straddling both the fixing portion 5 and the movable portion 4, and a second electrode 2b is arranged to a position covering about 40% of each the lengths of the thin plate portions 6 and 7. In this manner, piezoelectric/electrostrictive operating portions 2' which develop piezoelectric property have one ends thereof arranged on the fixing portion 5 and the other ends arranged in substantially same dimensions as the positions of second electrodes 2b on the thin plate portions 6 and 7. By arranging in this manner, at least joined portions of the thin plate portions 6 and 7 with the movable portion 4 and the fixing portion 5 are covered by the piezoelectric/electrostrictive layers 2a, and as the result, as mechanical strength is increased and the piezoelectric/electrostrictive operating portions 2' are arranged on predetermined positions on the thin plate portions, positions reaching 10 to 90% of the length of the thin plate portions 6 and 7, for example about 40% in the example of FIG. 2, a displacement to be generated can be increased.

It should be noted that from the point of securing strength at the joined portions, when a piezoelectric/electrostrictive layers 2a are arranged straddling both a fixing portion 5 and a movable portion 4, the positions of the ends thereof on the fixing portion 5 and the movable portion 4 are preferably at positions equivalent to more than one half of the thickness d of the thin plate portion. The reason is that by arranging in such manner, even if the piezoelectric/electrostrictive elements 2 are driven for an elongated time, the strength at the joined portions can be assuredly secured in stabilized way. Of course, the entire length of both portions may be covered. Further, not only the piezoelectric/electrostrictive layers 22a, but also the first electrodes 2c and the piezoelectric/electrostrictive layers 2a or the second electrodes 2b and the piezoelectric/electrostrictive layers 2a may be arranged straddling both the fixing portion 5 and the movable portion 4. In this case, by adjusting the length of the electrode which is not straddled the both portions, the piezoelectric/electrostrictive operating portions 2' which develop the piezoelectric property can be placed at desired positions.

In the embodiment shown in FIG. 2, two piezoelectric/electrostrictive elements 2 formed respectively on the thin plate portions 6 and 7 have a first electrode 2c thereof made to be for common use, and drawn out to one surface of the fixing portion 5 side where the hole 8 is apertured, a second electrode 2b is arranged to be directly drawn out to the fixing portion 5 side of the surface where respective piezoelectric/electrostrictive elements 2 are formed, and therefore on a portion of the other surface of the fixing portion 5 side where the hole 8 is apertured, namely the back surface 9 is unformed of an electrode, and the portion can be utilized for securing the device, thus the device can be secured with higher reliability. Further, the device may be secured on the fixing portion side of the one surface where the hole 8 is apertured, and in this case, electrical connections and securing of the device can be performed simultaneously, thus it is preferable in the point that the apparatus as the entirety can be compacted or the like.

Figure 3:
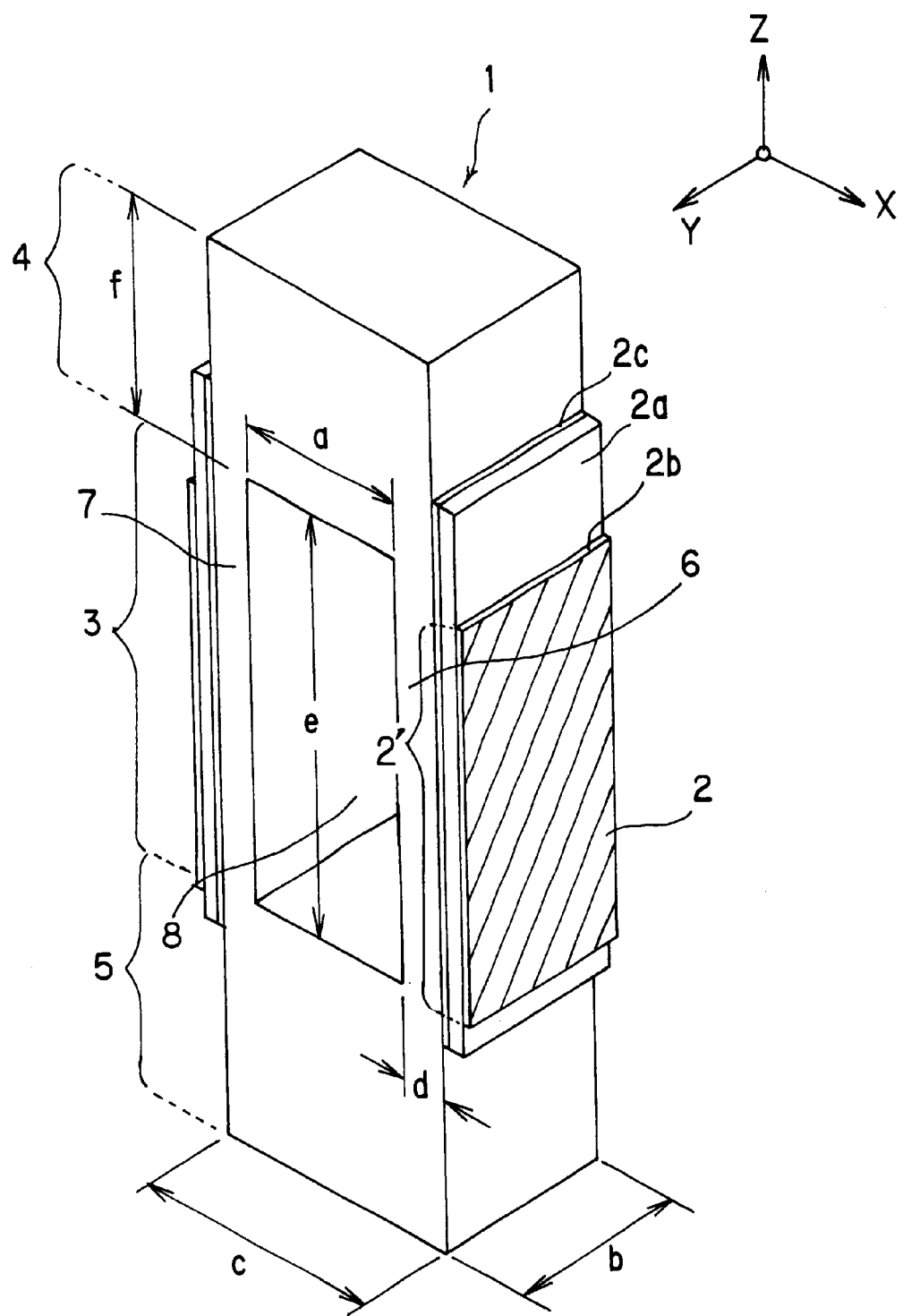
FIG. 3 shows a schematic perspective view describing a mutual relationship of respective members of a device of the present invention.

FIG. 3 shows a schematic explanatory view for describing mutual relationship of respective members of a device according to the present invention. In FIG. 3, in a direction in which a fixing portion 5 is connected with a movable portion 4, a first electrode 2c and a piezoelectric/electrostrictive layer 2a are arranged straddling both the fixing portion 5 and the movable portion 4, one end of a second electrode 2b exists on the fixing portion 5, and the other end thereof is arranged at a position to cover about 75% of the length of thin plate portions 6 and 7. A device 1 comprises respective members of a driving portion 3 to be driven by a displacement of a piezoelectric/electrostrictive element 2, a movable portion 4 to be displaced by a drive of the driving portion 3, and a fixing portion 5 for holding the driving portion 3 and the movable portion 4. The driving portion 3 comprises a pair of mutually opposing thin plate portions 6 and 7 and a pair of piezoelectric/electrostrictive element 2 formed on the outer surface of the thin plate portions 6 and 7, the fixing portion 5 and the movable portion 4 are coupled via the driving portion 3, and a part of a piezoelectric/electrostrictive operating portion 2' exists on the fixing portion 5, and a hole 8 is formed by inner walls of the driving portion 3, an inner wall of the movable portion 4, and an inner wall of the fixing portion 5. In a structure where the piezoelectric/electrostrictive operating portion 2' according to the present invention is arranged so as to overlap the fixing portion 5 or the movable portion 4 in this manner, the driving portion 3 is largely bent and displaced toward the outer space, thus the movable portion 4 can be largely displaced.

Here, in order to ensure the displacement mode, it is preferable that a distance where one end of the piezoelectric/electrostrictive element 2 overlaps the fixing portion 5 or the movable portion4 is made to be more than one half of the thickness d of the thin plate portions 6 and 7.

Further, of the thickness of the hole 8, namely the X-axis direction distance a in FIG. 3, and the width of the thin plate portions 6 and 7, namely the Y-axis direction distance b in FIG. 3, the device is structured so as to have the ratio a/b in a range of 0.5 to 20. The ratio is preferably to be 1 to 10, and more preferably to be 2 to 8. The defined value of the a/b is based on a finding that a displacement of a piezoelectric/electrostrictive device according to the present invention can be enlarged, and a dominant displacement in the X-Z plane in the drawings can be obtained. On the other hand, regarding the length of the thin plate portions 6 and 7, namely a distance e in the Z-axis direction in the drawings and the thickness a of the hole 8, the ratio e/a is preferably to be 0.5 to 10, and more preferably 0.7 to 5. The defined value of the ratio e/a is based on a finding that a piezoelectric/electrostrictive device according to the present application can generate a large displacement at a high resonant frequency, namely in a high speed of response. Accordingly, in order to make the present device to have a structure to generate a large displacement with a relatively low voltage, and superior in high speed responsibility, while suppressing a flapped displacement or vibrations in the Y-axis direction, it is specifically preferable to have the ratio a/b at 0.5 to 20 and the ratio e/a at 0.5 to 10, and extremely preferable to have the ratio a/b at 1 to 10, and the ratio e/a at 0.7 to 5. In the meantime, the hole 8 may be filled with a gel material, for example silicone gel.

The length f of the movable portion 4 shown in FIG. 3 is preferably shorter. The reason is that by the shortening, lightening of the weight and increase in the resonant frequency can be realized. However, in order to secure the rigidity of the movable portion 4 in the X-axis direction of the movable portion 4 and to ensure the displacement thereof, the ratio f/d with the thickness d of the thin plate portions is preferably 3 or more, and preferably 10 or more. It should be noted that actual dimensions of respective members are to be determined considering a bonding area for installing parts on the movable portion 4, a bonding area for mounting the fixing portion 5 on another member, a bonding area for installing electrode terminals and the like, mechanical strength and durability of the entire device, required displacement and resonant frequency, a driving voltage, and the like. Ordinarily, a is preferably 100 to 2000 $\mu$m, and more preferably 200 to 1000 $\mu$m. Ordinarily, b is preferably 50 to 2000 $\mu$m, and more preferably 100 to 500 $\mu$m.

Ordinarily, in order that an flapped displacement, namely a displacement component in the Y-axis direction can be effectively suppressed, d is made to be b>d in relation with the width b of the thin plate portions 6 and 7 and preferably to be 2 to 100 $\mu$m, and more preferably 4 to 50 $\mu$m. Ordinarily, e is preferably 200 to 3000, and more preferably 500 to 2000 $\mu$m. And ordinarily, f is preferably 50 to 2000 $\mu$m, and more preferably 100 to 1000 $\mu$m. By structuring in this manner, ordinarily, a displacement in the Y-axis direction is within a range of 10% of the displacement in the X-axis direction, or major axis direction, however, by suitably adjusting within a range between the preferable dimension ratios and actual dimensions, driving at a low voltage is made possible, and the displacement component in the Y-axis direction can be adjusted to 5% or less, which is an extremely superior effect. In other words, a substantially dominant displacement toward the X-axis, or the major axis is made obtainable. Thus, a large displacement with a relatively low voltage, and the superiority in high speed responsibility, in addition to features described previously, is attained.

Figure 18:
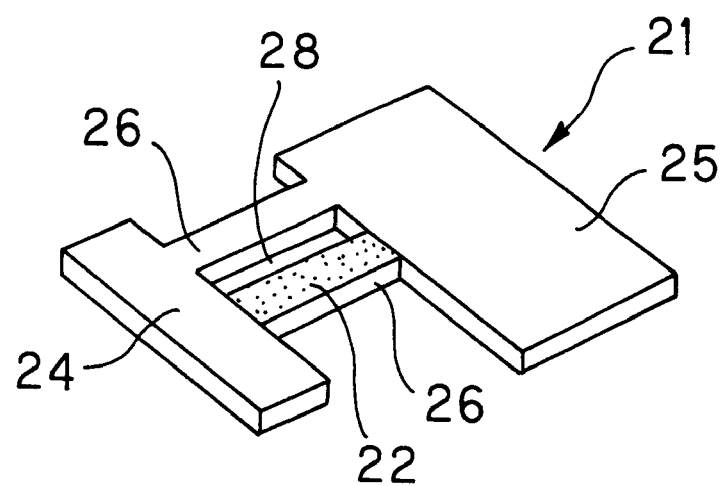
FIG. 18 shows a schematic perspective view of an embodiment of a conventional piezoelectric actuator.

In a device 1 according to the present invention, as a shape of the device is not a plate-like body like a device of the conventional art as shown in FIG. 18, the movable portion 4 and the fixing portion 5 are in a three dimensional solid shape, for example, in a rectangular solid shape, and the thin plate portions 6 and 7 are straddled so as to have sides of the movable portion 4 and the fixing portion 5 to be continuous, thus the rigidity of the device in the Y-axis direction can be selectively increased. In other words, with the device 1, only operation of the movable portion 4 in a plane including the driving direction of the driving portion 3, or in-plane of the X-Z plane, can be selectively generated, and operation of the movable portion 4 in the Y-Z plane and in the X-Y plane, namely operation in a so-called flapped direction can be suppressed.

A shape of the hole 8 formed by inner walls of the driving portion 3, an inner wall of the movable portion 4, and an inner wall of the fixing portion 5 can be optional, as long as the operation of the driving portion 3 is unobstructed.

Figure 4:
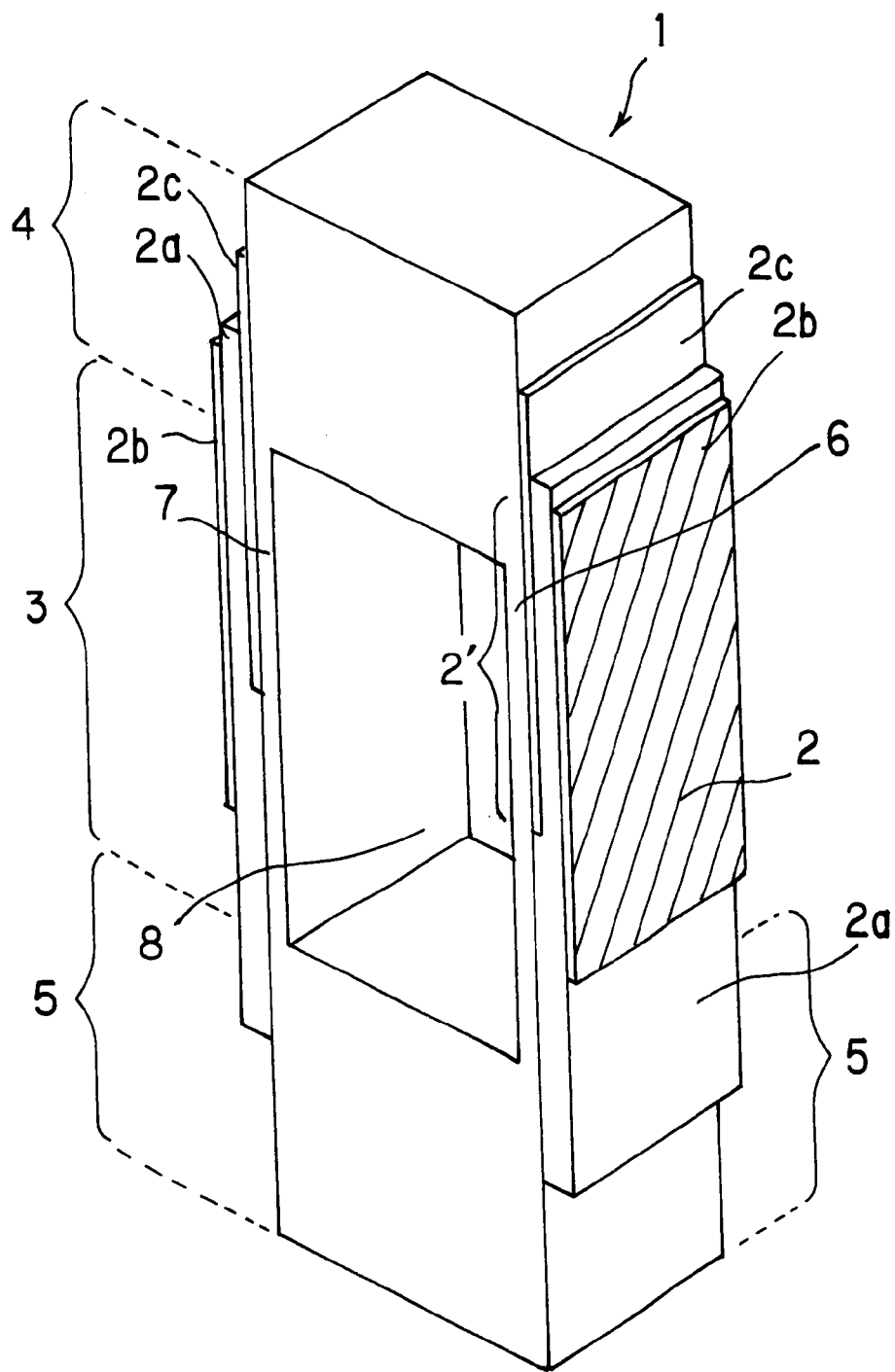
FIG. 4 shows a schematic perspective view of still another embodiment of a piezoelectric/electrostrictive device of the present invention.

A device shown in FIG. 4 is, different from the device shown in FIG. 2, an example where one end of a piezoelectric/electrostrictive operating portion 2'(comprising a pair of electrodes 2b and 2c and a piezoelectric/electrostrictive layer 2a)formed on the movable portion 4, and the other end thereof is formed, in a direction in which the fixing portion 5 is connected with the movable portion 4, so as to reach a position about 60% of the thin plate portions 6 and 7 from the side of the movable portion 4. Meantime, a piezoelectric/electrostrictive layer 2a and a second electrode 2b are extended to the fixing portion 5 to be formed.

Figure 5:
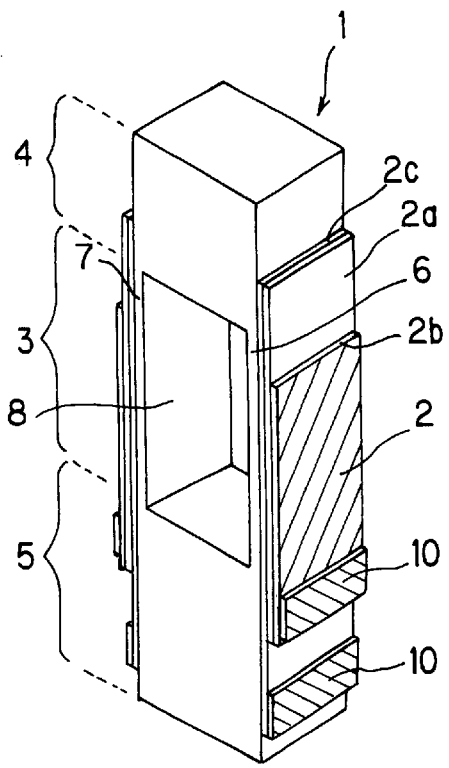
FIG. 5 shows a schematic perspective view of still another embodiment of a piezoelectric/electrostrictive device of the present invention.
Figure 6:
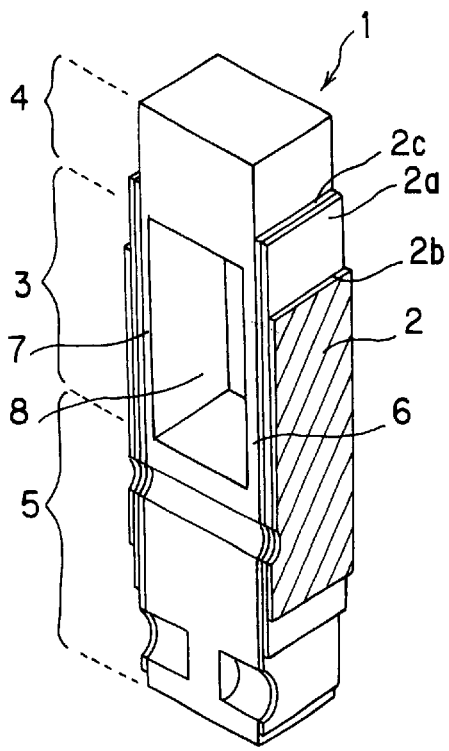
FIG. 6 shows a schematic perspective view of still another embodiment of a piezoelectric/electrostrictive device of the present invention.

Now, arrangement of a driving signal applying terminal 10 shown in FIG. 5 and FIG. 6 is described. FIG. 5 shows an example in which a driving signal applying terminal 10 is arranged on a side surface of the fixing portion 5, namely on the same surface where a piezoelectric/electrostrictive element is formed. According to the structure, a device can be secured independently of the surface where the terminal is formed, thus high reliability can be attained in securing the device and in connecting between a circuit and a terminal. In this embodiment, a terminal and a circuit are connected by use of the flexible print circuit (also called FPC), the flexible flat cable (also called FFC), the wire bonding, or the like. FIG. 6 shows an example where a driving signal applying terminal 10 is arranged on a surface which orthogonally crosses the surface where a piezoelectric/electrostrictive element is formed. If the surface where the driving signal applying terminal 10 is formed is utilized as a fixing face, connection of the driving signal applying terminal 10 with a circuit (not shown) and securing of the device per se can be simultaneously performed, which is an advantage.

In the embodiment shown in FIG. 6, through-holes are provided in advance on the fixing portion 5, the through-holes are then filled with a conductive material, then piezoelectric/electrostrictive patterns are formed such that respective electrodes are joined with the through-holes, and thereafter the filled surfaces of the through-holes are exposed by machining, and the surfaces are utilized as the driving signal applying terminals 10. A conductive wire may be embedded as the conductive material. In this example, a through-hole provided in the vicinity of the hole 8 is used as a common terminal. FIG. 5 and FIG. 6 show examples where a piezoelectric/electrostrictive layer 2a and a first electrode 2c are arranged straddling both the fixing portion 5 and the movable portion 4.

In addition to the effects described previously, as it is unnecessary for a device of the present invention to have the entirety thereof structured with a piezoelectric/electrostrictive material, there is an advantage that a material of the members other than the piezoelectric/electrostrictive element can be suitably selected depending on required characteristics of the respective members. In other words, by composing members other than the piezoelectric/electrostrictive element with a material light in weight, it is unlikely that the device will be influenced by harmful vibrations in operation, and in a similar manner, the mechanical strength, handling property, impact resistance, and humidity resistance can be improved with ease.

As a filler is not required, efficiency of the displacement due to the inverse piezoelectric effect or the electrostrictive effect is not deteriorated.

2. Constituting elements of the Device

Now, partially overlapping the foregoing description, respective elements constituting a device of the present invention are described individually and specifically with reference to the example of the device 1 shown in FIG. 3.

(1) Movable Portion and Fixing Portion

A movable portion 4 is a portion to be operated based on driving quantity of the driving portion 3, and a variety of members are fixed thereon depending on application uses of the device 1. For example, when the device is used as a displacement element, a shield of an optical shutter is fixed thereon, and when the device is used for positioning mechanism or a ringing suppressing mechanism of a hard disk drive, members that require positioning such as a magnetic head, a slider with a magnetic head mounted thereon, a suspension with a slider mounted thereon, or the like is fixed thereon.

A fixing portion 5 is a portion for holding a driving portion 3 and a movable portion 4, and by holding and securing the fixing portion 5 on any substrate, for example, when utilized for a positioning mechanism of the hard disk drive, on a carriage arm equipped to a VCM (voice coil motor), or on a fixing plate equipped to the carriage arm, suspension, or the like, the device as a whole is secured.

Further, electrode leads or other members for controlling a piezoelectric/electrostrictive element 2 may be arranged. Although a material constituting the movable portion 4 and the fixing material 5 is unlimited as long as the material has rigidity, a ceramic to which the ceramic green sheet laminating method, to be described later, is applicable can be preferably used. Specifically, though a material containing zirconia such as fully-stabilized zirconia or partially-stabilized zirconia, alumina, magnesia, silicon nitride, aluminum nitride, titanium oxide, or the like as the major component, and a material containing mixture thereof as the major component may be used, zirconia, specifically, a material containing fully-stabilized zirconia as the major component or a material containing partially-stabilized zirconia as the major component is preferable in points of high mechanical strength and toughness. It should be noted that the major component means that a component contained 50% or more in weight percent of the entirety. The members may be composed of a metallic material, or respective members may be composed of different materials.

(2) Driving Portion

A driving portion 3 is a portion to be driven by a displacement of a piezoelectric/electrostrictive element 2, and comprises mutually opposing thin plate portions 6 and 7 and piezoelectric/electrostrictive elements 2 respectively formed on surfaces of the thin plate portions 6 and 7.

1̂ Thin Plate portion

Thin plate portions 6 and 7 are thin-plate like members having flexibility, and have a function of amplifying an expansion or contraction displacement of a piezoelectric/electrostrictive element 2 arranged on the surface thereof as a bending displacement, and transmitting the bending displacement to a movable portion 4.

Accordingly, a shape and a material of the thin plate portions 6 and 7 are sufficed as long as having flexibility and having mechanical strength enough to be unfractured by the bending displacement, and can be suitably selected from ceramics and metals in the similar manner as the above-described movable portion and the fixing portion considering responsibility and operability of the movable portion.

Ordinarily, the thickness of the thin plate portions 6 and 7 is preferable around 2 to 100 μm, and combined thickness of the thin plate portion 6 or 7 and a piezoelectric/electrostrictive element 2 is preferably 7 to 500 μm. In order to increase targeted effect in a structure of a piezoelectric/electrostrictive device of the present invention, preferably, the thickness of electrodes 2b and 2c is 0.1 to 50 μm, and the thickness of a piezoelectric/electrostrictive layer 2a is 3 to 300 μm. The width of the thin plate portions 6 and 7 is preferably 50 to 2000 μm.

As a material composing the thin plate portions 6 and 7, ceramics similar to the movable portion 4 and the fixing portion 5 can be preferably used, and zirconia, among others, a material containing fully-stabilized zirconia as the major component, or a material containing partially-stabilized zirconia as the major component, is most preferably employed, as having enough mechanical strength as a thin-walled, high toughness, and small reactivity with a piezoelectric film or an electrode material when heat treated. The fully-stabilized zirconia or the partially-stabilized zirconia is preferably stabilized in the following way. Compounds that can be used to stabilize zirconia include yttrium oxide, ytterbium oxide, cerium oxide, calcium oxide, and magnesium oxide, and by adding and having contained at least one of the compounds, zirconia is partially or fully stabilized, however, zirconia can be stabilized as targeted, not only by adding one compound out of the above-listed, but also by adding a combination of the compounds.

As to addition quantity of respective compounds, it is 1 to 30 mol % (mole percent), preferably 1.5 to 10 mol % for yttrium oxide or ytterbium oxide, 6 to 50 mol %, and preferably 8 to 20 for cerium oxide, and 5 to 40 mol %, and preferably 5 to 20 mol % for calcium oxide or magnesium oxide. Among these, specifically, yttrium oxide is preferable as the stabilizer, and in the case, preferable quantity is 1.5 to 10 mol %, and more preferable the quantity is 2 to 4 mol %. As an additive for sintering aid or the like, alumina, silica, magnesia, oxide of transition metal, or the like may be added, and among these, alumina, magnesia, transition metal oxide, or the like may be preferably added within a range of 0.05 to 20 wt % (weight percent).

In order that the above-described mechanical strength and stable crystal phase can be obtained, it is preferable to have zirconia of average crystal grain size of 0.05 to 3 μm, and preferably of 0.05 to 1 μm or less. As described previously, although ceramics similar to the movable portion 4 and the fixing portion 5 can be used for the thin plate portions 6 and 7, it is preferable to have the thin plate portions 6 and 7 composed of substantially the same material in view of achieving reliability in joined portions, mechanical strength of the device, and reduction of complication in fabrication.

2̂ Piezoelectric/Electrostrictive Element

A piezoelectric/electrostrictive element 2 comprises at least a piezoelectric/electrostrictive layer and a pair of electrodes for applying a voltage across the piezoelectric/electrostrictive layer, and conventionally known piezoelectric/electrostrictive element of unimorph-type, bimorph-type, or the like can be used. As the unimorph-type is superior in stability of displacement quantity to generate and advantageous in lightening of the weight, it is preferable that a device of the present application comprises a unimorph-type piezoelectric/electrostrictive element. For example, as shown in FIG. 7, a laminated type piezoelectric/electrostrictive element 2 or the like having a first electrode 2c, a piezoelectric/electrostrictive layer 2a, and a second electrode 2b laminated in layers can be preferably used.

Figure 7:
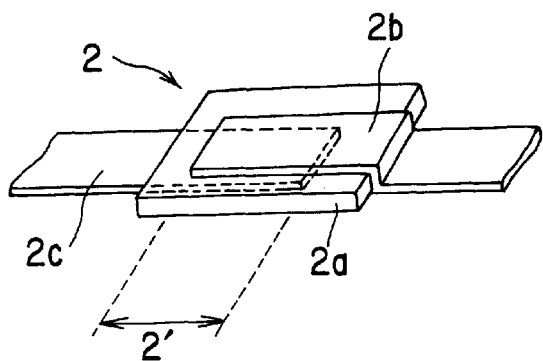
FIG. 7 shows a schematic perspective view of an embodiment of a piezoelectric/electrostrictive element constituting a piezoelectric/electrostrictive device of the present invention.

In the piezoelectric/electrostrictive element shown in FIG. 7, ordinarily, when a piezoelectric material such as a ferroelectric material, or the like, is used for a piezoelectric/electrostrictive layer, by applying a voltage across the above-described electrodes (for example, between the second electrode 2b and the first electrode 2c), an electric field is activated for the piezoelectric/electrostrictive layer 2a, and based on the electric field, the electric field induced strain is induced to the piezoelectric/electrostrictive layer 2a, then the piezoelectric/electrostrictive element has a function, as a transverse effect thereof, of generating mainly a strain of contracting mode in a direction parallel to the main surface of the piezoelectric/electrostrictive layer 2a. Accordingly, if the piezoelectric/electrostrictive element of the structure is applied to a device of the present invention, the strain contracting toward the main surface described previously is converted into a bending strain which causes the thin plate portions 6 and 7 to bend, and the driving portion 3 is made to bend and displace in a direction toward the outer space (direction opposition to the hole) with the joined portions of the thin plates 6 and 7 with the movable portion 4, or the thin plate portions 6 and 7 with the fixing portion 5 as the fulcrums, and as the result, the movable portion 4 can be displaced in a predetermined direction.

Further, it is also preferable that, in addition to a structure where the piezoelectric/electrostrictive layer 2a is interposed by a pair of electrodes, a piezoelectric film 2a is further formed on the second electrode 2b, and a third electrode is further formed on the piezoelectric film 2a, to have a piezoelectric/electrostrictive element of a structure having piezoelectric/electrostrictive operating portions in two layers. Further, it is also preferable to have a structure where lamination of an electrode and a piezoelectric/electrostrictive layer is repeated, namely a structure where the piezoelectric/electrostrictive operating portion is made in three layers, four layers, five layers, or more. By thus making the piezoelectric/electrostrictive operating portion in a multi-layered structure, driving force of the driving portion is increased, resulting in an enlarged displacement, and also in a structure where rigidity of the device per se is increased, for example, in a structure having thickened thin plate portions or the like, a larger displacement and higher resonant frequency can be made compatible with ease.

Figure 10:
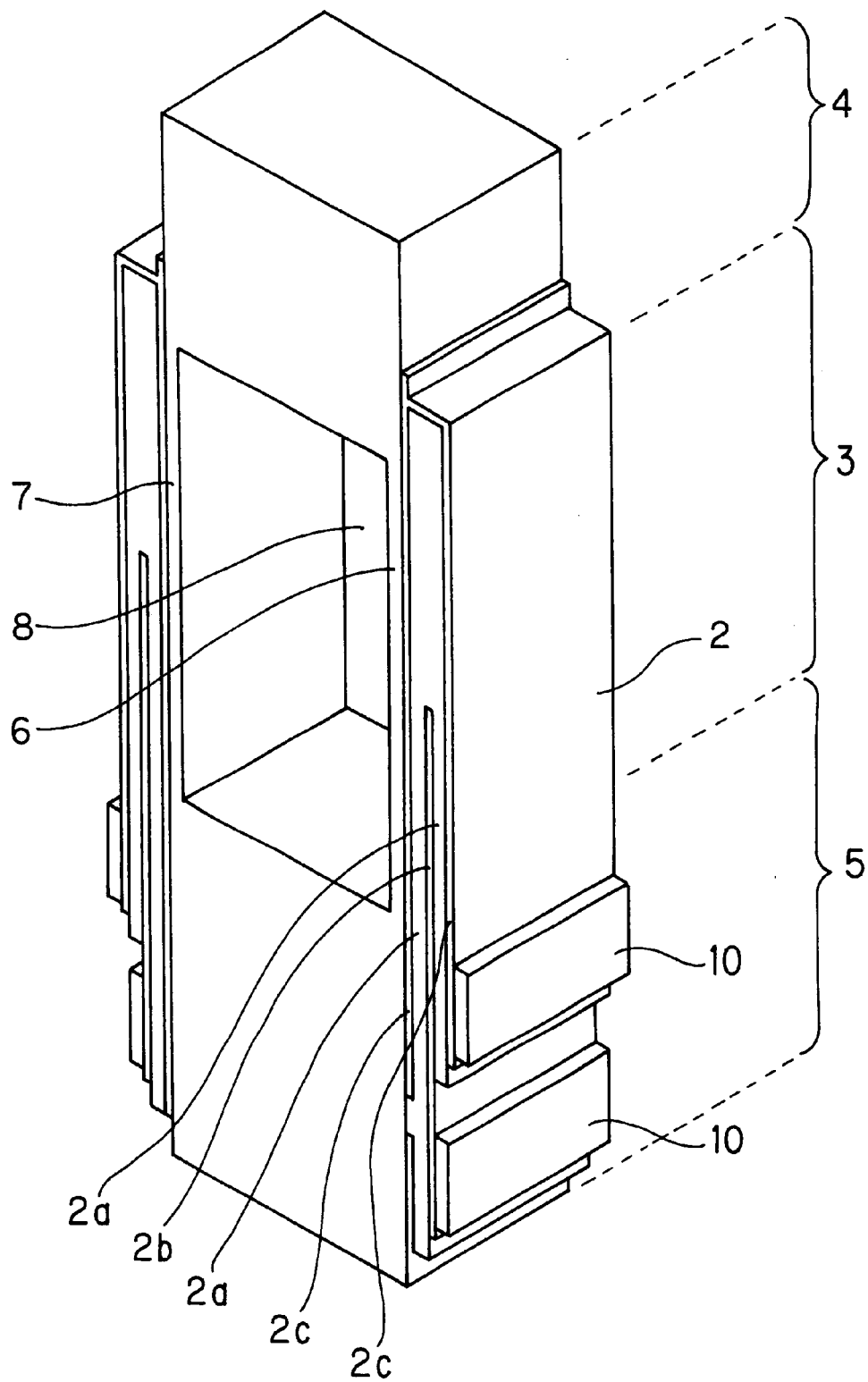
FIG. 10 shows a schematic perspective view of still another embodiment of a piezoelectric/electrostrictive device of the present invention.

For example, FIG. 10 shows a device having the operating portion in the piezoelectric/electrostrictive element in a two-layered structure. Piezoelectric/electrostrictive elements 2, having the element structure shown in FIG. 7, are respectively laminated sequentially by a first electrode 2c, a piezoelectric/electrostrictive layer 2a, a second electrode 2b, a piezoelectric/electrostrictive layer 2a, and a first electrode 2c, thus the piezoelectric/electrostrictive operating portion comprising a pair of electrodes and a piezoelectric/electrostrictive layer is placed in two layers in a direction in which composing films of the element are formed by lamination. Further, electrodes in the same element denoted by the same symbol are made to be used in common and to be applied with a voltage of the same potential. Furthermore, terminals to apply an electric signal to flow to respective electrodes are all formed on surfaces of the fixing portion where the elements are formed. Though, in FIG. 10, the first electrode 2c is structured to be commonly used by the piezoelectric/electrostrictive operating portion of the first layer and the piezoelectric/electrostrictive operating portion of the second layer, this may be of course individually structured. Further, one ends of a piezoelectric/electrostrictive operating portions exist on the fixing portion, and the other ends are arranged on the thin plate portions 6 and 7, and the first electrode 2c and the piezoelectric/electrostrictive layer 2a are arranged on the movable portion 4.

Figure 11:
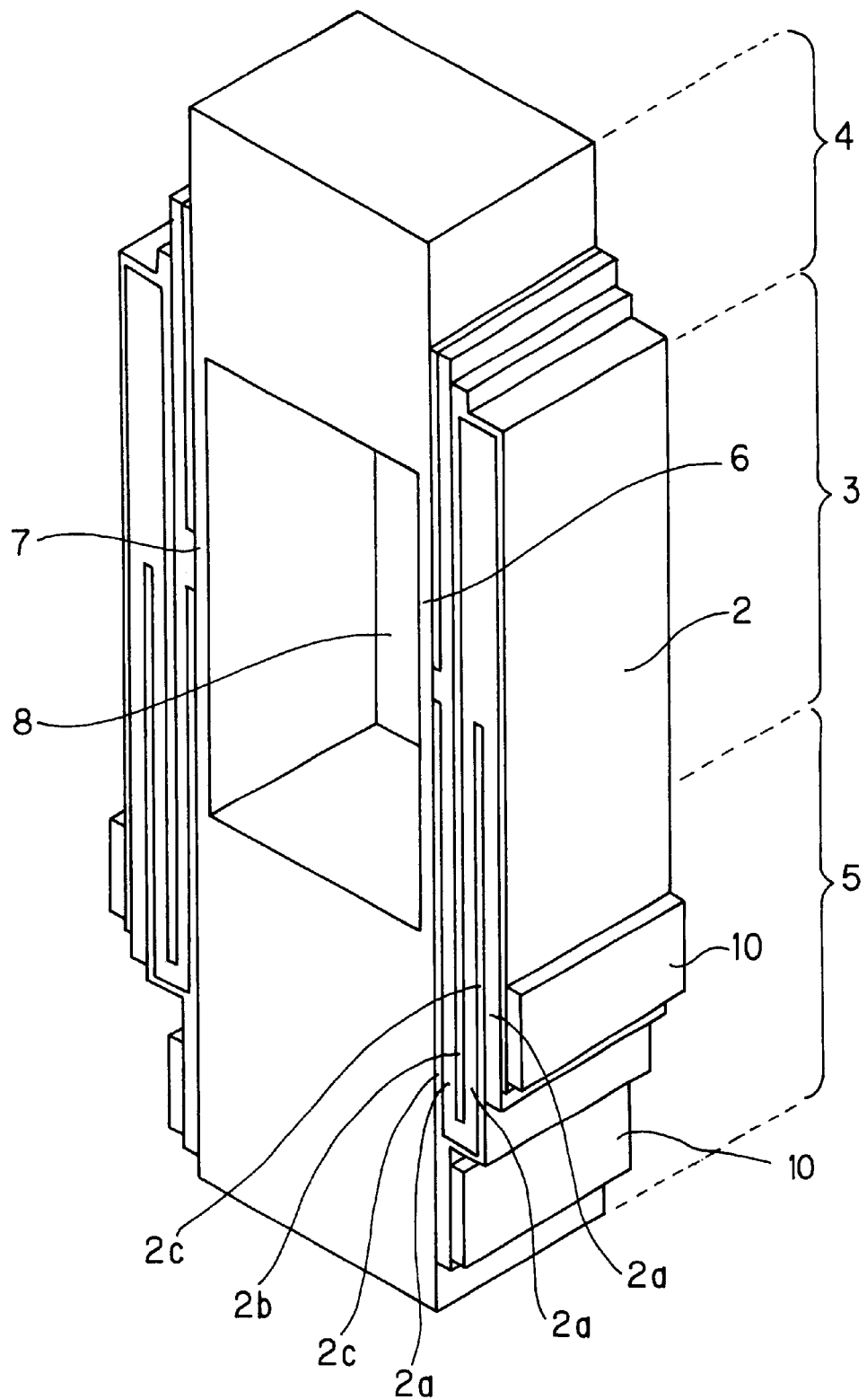
FIG. 11 shows a schematic perspective view of still another embodiment of a piezoelectric/electrostrictive device of the present invention.

FIG. 11 shows a piezoelectric/electrostrictive element having the piezoelectric/electrostrictive operating portion in three layers. More in detail, a first electrode 2c, a piezoelectric/electrostrictive layer 2a, a second electrode 2b, a piezoelectric/electrostrictive layer 2a, a first electrode 2c, a piezoelectric/electrostrictive layer 2a, and a second electrode 2b are sequentially laminated, and the piezoelectric/electrostrictive operating portion comprising a pair of electrodes and a piezoelectric/electrostrictive layer 2a is placed in three layers in a direction in which composing films of the element are formed by lamination. Similarly with the device shown in previous FIG. 10, electrodes in the same element and denoted by the same symbol are made to be commonly used and to be applied with a voltage of the same potential. Further, terminals 10 to apply an electric signal to respective electrodes are all formed on surfaces of the fixing portion 5 where elements are formed. Though, similarly with the device shown in FIG. 10, in this embodiment as well, the first electrode 2c and the second electrode 2b are respectively made to be shared and to be commonly used by the piezoelectric/electrostrictive operating portions of the first layer, the second layer, and the third layer, respective electrodes may be independently arranged. In this case, respective electrodes are called the first, second, third, and forth electrode sequentially from the one closest to the thin plate portions 6 and 7. Of course, one ends of piezoelectric/electrostrictive operating portions 2' exist on the fixing portion 5, and the other ends are arranged on the thin plate portions 6 and 7, an second electrodes 2b and piezoelectric/electrostrictive layers 2a are arranged on the movable portion 4.

As for the wiring manner of electrodes for a multi-layered piezoelectric/electrostrictive operating portion 2', if electrodes can be used commonly, the number of terminals can be reduced, thus realizing an advantage of facilitating driving and fabrication. On the other hand, if all electrodes are arranged independently, respective piezoelectric/electrostrictive operating portions can be operated by different signals, thus enabling displacement control in higher precision.

If the number of layers of the piezoelectric/electrostrictive operating portion is increased, although driving force can be increased, power consumption also increases accompanying thereto, thus when actually implemented, the number of layers are to be suitably determined depending on application uses and the specification. As can be understood from the embodiments shown in the drawings, a device according to the present invention is basically unchanged in distance in the width direction of the thin plate portion, even if the driving force of the device is increased by increasing the number of the layers, the device can be extremely preferable in, for example, positioning a magnetic head, in a control device for ringing suppression for a hard disk drive, or the like, used in an extremely narrow space.

Figure 8:
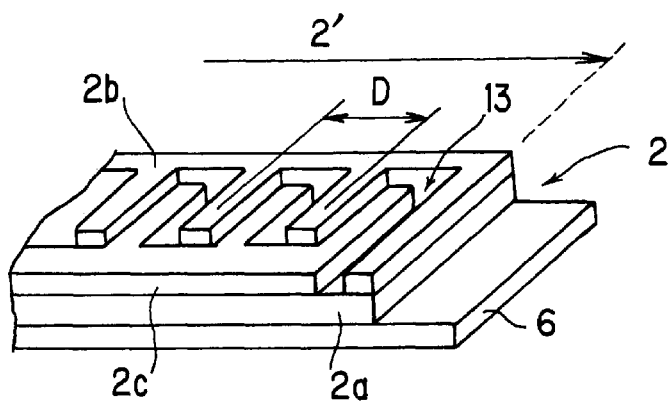
FIG. 8 shows a schematic perspective view of another embodiment of a piezoelectric/electrostrictive element constituting a piezoelectric/electrostrictive device of the present invention.

Also, a piezoelectric/electrostrictive element 2 comprising a first electrode 2b and a second electrode 2c both being comb-shaped structure, as shown in FIG. 8, and having a structure that the first electrode 2c and the second electrode 2b are mutually opposed with a gap 13 of predetermined width between teeth of mutual combs may also be used. In FIG. 8, although the first electrode 2c and the second electrode 2b are arranged on the upper surface of the piezoelectric/electrostrictive layer 2a, the electrodes may also be formed between the thin plate portion 6 and the piezoelectric layer 2a, or the electrodes may also be formed on both of the upper surface of the piezoelectric layer 2a and between the thin plate portion 6 and the piezoelectric layer 2a, which are also preferable.

In other words, in the piezoelectric/electrostrictive element 2 of the present structure, electrodes are formed at least one main surface of at least piezoelectric/electrostrictive layer 2a. Further, the piezoelectric/electrostrictive element 2 shown in FIG. 9 also comprises a first electrode 2c and a second electrode 2b of the comb-shaped structure, and the first electrode 2c and the second electrode 2b are structured to be mutually opposed with a gap 13 of a predetermined width between teeth of mutual combs. Although the piezoelectric/electrostrictive element 2 is structured so as to have a piezoelectric layer 2a embedded in the gap 13 between the first electrode 2c and the second electrode 2b, such piezoelectric/electrostrictive element can also be preferably used by a device of the present invention. When the device shown in FIG. 8 is compared with the device shown in FIG. 9, the device of the structure shown in FIG. 8 has an advantage that power consumption is smaller.

Figure 9:
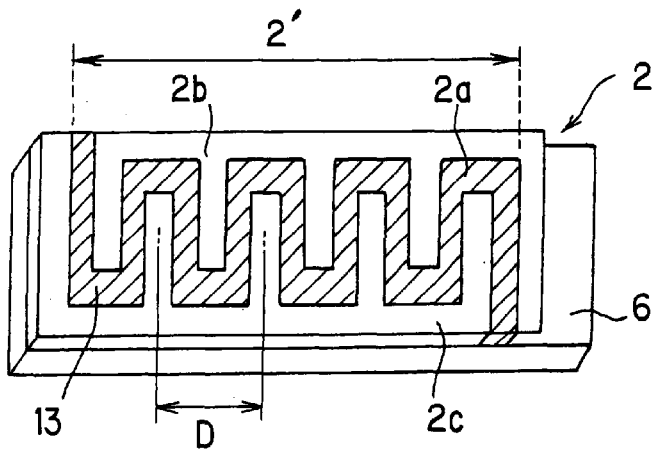
FIG. 9 shows a schematic perspective view of still another embodiment of a piezoelectric/electrostrictive element constituting a piezoelectric/electrostrictive device of the present invention.

As for the piezoelectric/electrostrictive elements 2 respectively shown in FIG. 8 and FIG. 9, when a voltage is applied across comb-shaped electrodes and an electric field is activated to a piezoelectric/electrostrictive layer 2a, based on the electric field, the electric field induced strain is induced to the piezoelectric/electrostrictive layer 2a, then the piezoelectric/electrostrictive elements 2 have a function, as a longitudinal effect thereof, of mainly generating a strain in an expanding mode toward the direction of the electric field, namely in a direction parallel to the main surfaces of the thin plate portions 6 and 7. Accordingly, if a piezoelectric/electrostrictive element 2 of the present structure is applied to a device of the present invention, the strain expanding in the main surface direction described previously is converted into a bending displacement which causes the thin plate portions 6 and 7 to bend, and the driving portion 3 is bent and displaced in a direction toward outer space (direction of the hole) with the joined portions of the thin plate portions 6 and 7 with the movable portion 4 or of the thin plate portions 6 and 7 with the fixing portion 5 as the fulcrums, and as the result, the movable portion 4 can be displaced in a predetermined direction. It should be noted that, ordinarily, an element having a comb-shaped electrode structure is arranged such that the pitch direction of the comb-shaped teeth is made to be a direction in the thin plate portions 6 and 7 in which the fixing portion 5 is connected with the movable portion 4. By arranging in this manner, the strain in the expansion mode based on the longitudinal effect of the electric field induced strain can be effectively utilized for the bending displacement. When a piezoelectric/electrostrictive element having comb-shaped electrodes as the piezoelectric/electrostrictive elements shown in FIG. 8 and FIG. 9 is used, by reducing a pitch D of teeth of a comb, the displacement of a piezoelectric/electrostrictive device can be enlarged.

Anyway, of a piezoelectric/electrostrictive element 2 comprising a pair or more of electrodes and a piezoelectric/electrostrictive layer formed on at least a part of the outer surface of at least one thin plate portion of the thin plate portions 6 and 7, at least a piezoelectric/electrostrictive layer 2a of the piezoelectric/electrostrictive element 2 is required to exist extended over the movable portion 4 and the fixing portion 5, and one end of the piezoelectric/electrostrictive operating portion 2' in a direction in which the fixing portion is connected with the movable portion exists on the fixing portion 5 or the movable portion 4, and the other end of the piezoelectric/electrostrictive operating portion is formed on the thin plate portions 6 and 7, in other words, the piezoelectric/electrostrictive element 2 is required to be formed on the thin plate portions 6 and 7 which are constituting members of the driving portion, so as to be extended from the end on the fixing portion or the movable portion to have a length to cover 10 to 90%, preferably 25 to 75% of the thin plate portion. The piezoelectric/electrostrictive element 2 may be sufficed if formed on either one of the thin plate portions 6 and 7, as described previously, however, the element may also be formed respectively on both the thin plate portions 6 and 7.

Although a piezoelectric/electrostrictive element 2 is, as shown in the above-described drawings, preferably formed on the outer surface of the device 1 in view of making the driving portion largely driven, the element may also be formed on an inner surface (namely in the hole) of the device 1, and also may formed on both the inner surface and the outer surface of the device 1. When the piezoelectric/electrostrictive element 2 is formed on the inner surface of the device 1, one of methods of forming thereof is that the element is simultaneously formed at least when the base portion comprising the thin plate portions, fixing portion, and movable portion, to be described later, is fabricated, so as to have a piezoelectric operating portion formed overlapping the fixing portion or the movable portion. For a piezoelectric/electrostrictive layer, though a piezoelectric material is preferably used, an electrostrictive material or ferroelectric material, or antiferroelectric material can also be used. However, when the piezoelectric/electrostrictive element is used for a magnetic head or the like, linearity between the displacement quantity of the movable portion and the driving voltage or the output voltage being considered to be important, a material having small strain hysteresis can be preferably used, and a material with coercive electric field of 10 kV/mm or less is preferably used.

Specifically, as a material for forming a piezoelectric/electrostrictive layer, listed is a material containing, singularly or as a mixture thereof, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate, or the like. Particularly, in view of high electromechanical coupling factor and high piezoelectric constant, small reactivity with the thin plate portion (ceramics) when sintering the piezoelectric/electrostrictive layer, and stable composition of the final product, a material containing lead zirconate, lead titanate, and lead magnesium niobate as the major component, or a material containing sodium bismuth titanate as the major component is preferably used.

Further, to the above-described material for a piezoelectric/electrostrictive layer, may be added is ceramics of the oxide of the following, singularly or as a mixture thereof, such as lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, or the like. For example, if the material whose major component is a mixture of lead zirconate and lead titanate, and lead magnesium niobate is made to contain lanthanum or strontium, an advantage may be obtained that coercive electric field or piezoelectric characteristic may become adjustable. It is, however, preferable to avoid adding of a material which is likely to be vitrified such as silica or the like. The reason is that, when a piezoelectric/electrostrictive layer is heat treated, the material such as silica or the like is apt to react against a piezoelectric/electrostrictive material, causing composition variation of the piezoelectric/electrostrictive layer to deteriorate the piezoelectric characteristic.

On the other hand, it is preferable that the electrode for a piezoelectric/electrostrictive element is composed of a metal which is a solid at room temperature and superior in conductivity, such as, for example, as a single metal or as an alloy thereof, aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like. Further, a cermet material made by dispersing these materials with the same material as for the piezoelectric layer or the thin plate portion may also be used.

A material of the electrode in the piezoelectric/electrostrictive element is selected depending on a method of forming the piezoelectric/electrostrictive element. For example, when a piezoelectric/electrostrictive layer is formed on a first electrode by sintering, after the first electrode is formed on the thin plate portion, the first electrode requires to use a metal of high melting point such as platinum or the like which is uninfluenced at the sintering temperature of the piezoelectric/electrostrictive layer, while a metal of low melting point such as aluminum, gold, silver, or the like can be used for a second electrode to be formed on the piezoelectric/electrostrictive layer after the piezoelectric/electrostrictive layer is formed, as the electrode can be formed at a low temperature.

Furthermore, the thickness of an electrode may also be not a small factor for reducing the displacement of a piezoelectric/electrostrictive element, particularly of the second electrode shown in FIG. 7 to be formed after the piezoelectric/electrostrictive layer is sintered, or the comb-shaped electrode shown in FIG. 8, or the like, it is preferable to use a material of an organic metal paste, for example, gold resinate paste, platinum resinate paste, silver resinate paste, or the like, which produces a finer and thinner film after being sintered. It should be noted that in the present invention, with a piezoelectric/electrostrictive element shown in FIG. 7, when a piezoelectric/electrostrictive layer 2a and, upon request, a first electrode 2c are arranged straddling both the fixing portion 5 and the movable portion 4, if ends thereof on the fixing portion 5 and the movable portion 4 are arranged at a position corresponding to one half or more of the thickness d of the thin plate portion respectively exceeding the joined portions, an advantage is displayed that not only the joining strength is held but also a large displacement quantity is obtained.

Of course, the entire length of both portions may be covered. Further, instead of the combination of the first electrode 2c and the piezoelectric/electrostrictive layer 2a, a second electrode 2b and a piezoelectric/electrostrictive 2a may be arranged straddling both the fixing portion 5 and the movable portion 4. In this case, by adjusting the length of the first electrode 2c, the positions of the piezoelectric/electrostrictive operating portions 2' on the thin plate portions 6 and 7 can be placed at desired positions.

Figure 12A:
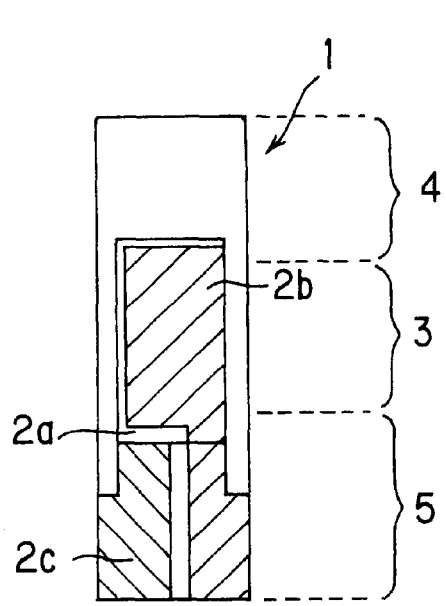
FIGS. 12($a$) and ($b$) show schematic explanatory views of embodiments of electrode lead arrangement methods of a piezoelectric/electrostrictive device of the present invention.
Figure 12B:
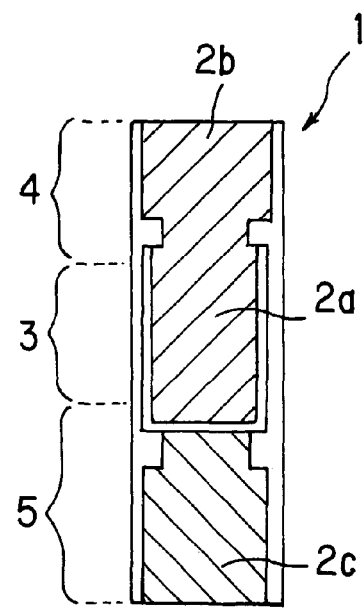

A variety of modes are available for electrode leads from a piezoelectric/electrostrictive element. Although not shown, a device 1 having piezoelectric/electrostrictive elements 2 formed on both the opposing thin plate portions 6 and 7 may have a mode where first electrode 2c of two piezoelectric/electrostrictive elements is made to be a common electrode, and the electrode is drawn out to one surface of the fixing portion 5 side with the hole 8 apertured, and second electrodes 2b are directly drawn out to the fixing portion 5 side of a surface where respective piezoelectric/electrostrictive elements 2 are formed. Such mode is preferable in that the device can be reliably secured and compacted, as an electrode is unformed on a portion of the other surface of the fixing portion 5 with the hole 8 apertured, and the device can be secured thereon utilizing the portion. It is also preferable to have a mode where a second electrode 2b and a first electrode 2c are drawn out so as to be juxtaposed on the fixing portion 5 side of a surface where respective piezoelectric/electrostrictive elements 2 are formed as shown in FIG. 12(a), or one of other modes where both a second electrode 2b and a first electrode 2c are drawn out, after being separated, to the movable portion 4 side and to the fixing portion 5 side of surfaces where respective piezoelectric/electrostrictive elements 2 are formed, as shown in FIG. 12(b).

3. Method of Fabricating the Device

Now, a method of fabricating a device according to the present invention is described.

It is preferable that materials composing respective members of a device of the present invention is to be ceramics, and constituting elements of the device, namely base portion excepting a piezoelectric/electrostrictive element, such as thin plate portions 6 and 7, a fixing portion 5, and a movable portion 4, are fabricated by way of the ceramic green sheet laminating method, and it is more preferable that they are fabricated by laminating integration by co-firing. On the other hand, it is preferable to fabricate a piezoelectric/electrostrictive element and respective terminals by use of the film forming method for a thin film, or a thick film, or the like, which forms these members to be in film-like. The ceramic green sheet laminating method, which is capable of integrally forming respective members of the base portion of the device, is a ready method in realizing high reliability and securing rigidity in joined portions, as the method hardly causes the state variation with time of joined portions of respective members. In a device according to the present application, the joined portions of the thin plate portions, constituting the driving portion, with the fixing portion and the movable portion serve to be fulcrums for developing a displacement, reliability in the joined portion is a crucially important point that dominates the characteristic of the device. As this method is also superior in productivity and formability, a device of a predetermined shape can be obtained in short time with satisfactory reproducibility.

There being expressions of a thin plate and thin plate portion in the present application, in principle, the former is used to represent a member related with a green sheet in the method of fabrication, and the latter is used to represent a portion constituting, together with a piezoelectric/electrostrictive element, the driving portion in a laminate.

(1) Fabricating the Laminate

Firstly, a slurry is prepared by adding and mixing ceramic powder such as zirconia or the like with a binder, a solvent, a dispersant, a plasticizer, or the like, and after the slurry is processed for degassing, a ceramic green sheet having a predetermined thickness is fabricated by a method such as the reverse roll coater method, the doctor blade method, or the like.

Figure 13A:
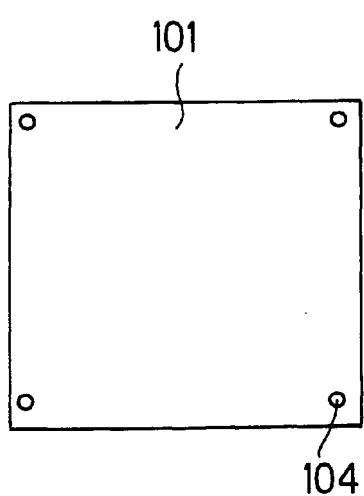
FIGS. 13($a$) and ($b$) show schematic explanatory views of examples of ceramic green sheets used in fabricating a piezoelectric/electrostrictive device of the present invention.

Then, the ceramic green sheet is machined into a variety of shapes, for example, as shown in FIGS. 13(a) and (b), by use of a method such as the stamping method using a die (punching), the laser machining, or the like. As for a method of fabricating a laminate, in principle, a method disclosed in the specification of Japanese Patent Application No. 11-375581 filed on Dec. 28, 1999 may be relied upon. Contents of the application are quoted herein for reference.

Figure 13B:
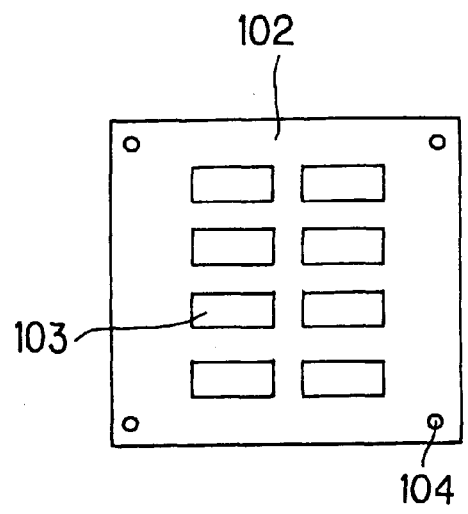
Figure 14A:
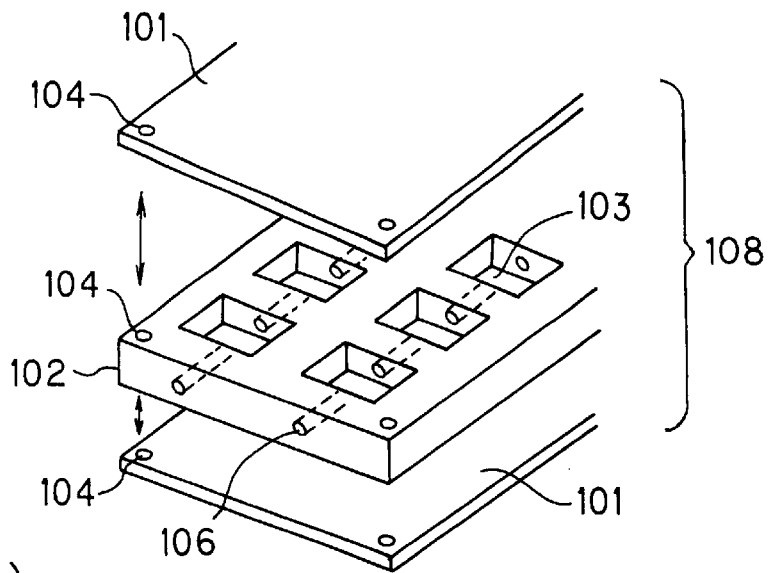
FIGS. 14($a$), ($b$), ($c$), and ($d$) show process drawings of an embodiment of a method of fabricating a piezoelectric/electrostrictive device of the present invention.
Figure 14B:
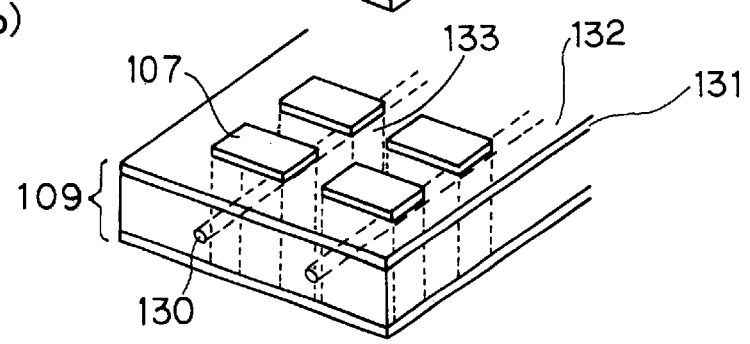
Figure 14C:
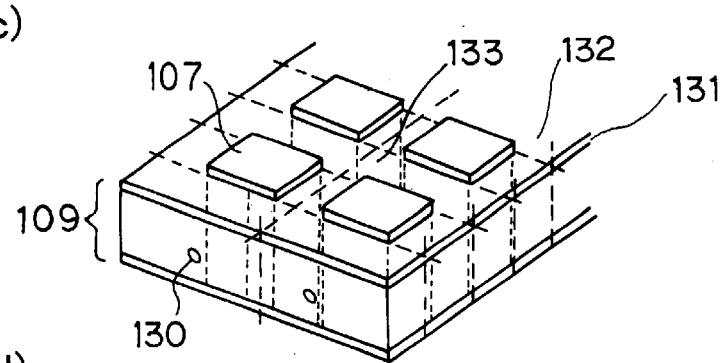
Figure 14D:
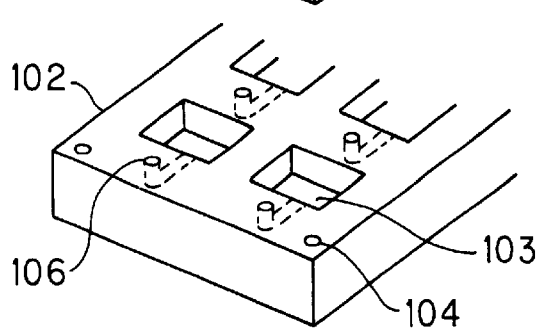

FIG. 13(a) exemplarily shows a ceramic green sheet 101, which is a ceramic green sheet to be a thin plate after being sintered, and FIG. 13(b) exemplarily shows a ceramic green sheet 102 having at least one rectangular hole 103 formed thereon, which is a ceramic green sheet for members to be a movable portion and a fixing portion. With the ceramic green sheet 102, by forming holes 103 in one or more rows so as to be juxtaposed, a plurality of devices can be obtained at one time, or at least one device having a plurality of movable portions thereon can be obtained.

Using at least two ceramic green sheets to be a thin plate and at least one ceramic green sheet having at least one hole formed thereon, prepared in advance, for example, by laminating at least one ceramic green sheet having the at least one hole formed thereon between at least two ceramic green sheets to be the thin plate, a ceramic green laminate, comprising a ceramic green sheet to be a pair of thin plates and a series of ceramic green sheets having at least one hole formed thereon, may be fabricated.

Of course, the method of fabricating the ceramic green laminate, in other words, the laminating order of the ceramic green sheet to be the thin plate and the ceramic green sheet having at least one hole formed thereon has no specific limitation, and ordinarily the lamination is possible at an optional sequence as long as the laminate unfavorably influence the steps to follow.

For example, steps to prepare the above-described ceramic green laminate include a step where ceramic green sheets to be a pair of thin plates are laminated mutually opposed, a step where ceramic green sheets to be a pair of thin plates respectively laminated on the outermost layers mutually opposed, a step to prepare a ceramic green sheet to be a thin plate laminated by at least one ceramic green sheet having at least one hole formed thereon, a step to prepare a ceramic green sheet to be a thin plate laminated with desired number of a ceramic green sheet having at least one hole formed thereon, a step to prepare at least one ceramic green sheet having the at least one hole formed thereon laminated with a ceramic green sheet to be a pair of thin plates on the outermost layer mutually opposed, a step wherein two laminates A with a ceramic green sheet to be a thin plate laminated with at least one ceramic green sheet having at least one hole formed thereon are prepared, one ceramic green sheet having at least one hole formed there on or a laminate B laminated with a plurality of ceramic green sheets having at least one hole formed thereon is prepared, and when the two laminates A are laminated so as to make respective thin plates to be mutually the outermost layer, the lamination is performed with an intervention of the one ceramic green sheet having at least one hole formed thereon or the laminate B, and the like.

When a device according to the present application is fabricated by the ceramic green sheet laminating method, while the hole is being formed by laminating thick sheets, differences in dimensions are, by chance, likely to occur between the lengths of a pair of thin plate portions governing the driving portion, by deterioration of machining precision accompanied by shrinkage of a ceramic green sheet, or difference in dimension precision or the like accompanied to machining of a ceramic green sheet when the ceramic green sheet is thicker, or slippage of the position due to deformation of a sheet while laminating. The differences in dimensions of a pair of the thin plate portions are manifested per se by differences of the displacement in the left-to-right direction (the X-axis direction), and further cause the movable portion to be likely to include a component in the rotational direction in the displacement mode of the movable portion, making it difficult for the movable portion to dominantly displace in a direction of a specific axis.

Countermeasures against such problems include a step wherein, when laminating at least a plurality of ceramic green sheets having the at least one hole formed thereon, a ceramic green sheet mounted on a plastic film and having at least one hole formed thereon is laminated on a surface to be the outermost layer of a ceramic green laminate having the at least one hole formed thereon such that the plastic film constitutes a new outermost layer, and after the hole is accurately positioned, the plastic film is removed, or a step wherein a ceramic green sheet mounted on a plastic film and having at least one hole formed thereon is laminated on a ceramic green sheet to be the thin plate, such that the plastic film forms the outer layer thereof, and after the hole is accurately positioned, the plastic film is removed, and by employing either of the steps, not only deformation at the time of handling the green sheet can be substantially avoided, but also both surfaces to be the outermost surfaces can be made in the same shape, and as the result, it becomes possible to have the hole accurately positioned, thus laminating precision is improved, and machining precision is also improved to stabilize dimensions, realizing improvement of characteristic of the device, for example, displacement characteristic.

Moreover, out of methods of fabricating by use of the plastic film, the former is high in laminating efficiency required until the final laminate is obtained, and it is also a method effective in reducing the number of steps of fabrication. On the other hand, the latter method is advantageous in providing a joining assistant layer, to be described later, in order to ensure the joined property of the laminating interface.

In other words, as for the number of steps for lamination, in the former method, a ceramic green sheet formed on a plastic film and other ceramic green sheet having a hole can be laminated for one time, and after the lamination, opposing surfaces from which plastic films are removed and a ceramic green sheet to be a thin plate can be respectively laminated for one time, and therefore the total number of laminations is at least two times, which is an efficient method. However, in the latter method, for the opposing thin plate portions, a ceramic green sheet to be a thin plate and a ceramic green sheet mounted on a plastic film and having a hole are required to laminate respectively in separate steps, and thereafter, a ceramic green sheet having a hole formed thereon is laminated. Accordingly, the number of laminations required is at least three times, which is more than the former.

Moreover, on the other hand, as for the adhesive assistant layer for improving laminating property of a ceramic green sheet, ordinarily, the adhesive assistant layer is formed on substantially entire surface of a ceramic green sheet prior to machining for a hole, or the like, and thereafter, a predetermined hole is formed by the punching or the like using a die, and then a predetermined number of the ceramic green sheets are to be laminated; however, when this is applied to the former method, a joining assistant layer is required to be formed on the laminating surface with the thin plate after the film is exfoliated and removed. At this time, despite that the shape is accurately produced by use of machining with a die, or the like, there is a large possibility that the shape precision may be lowered by the joining assistant layer formed. Further, although there is a means to provide a joining assistant layer for a green sheet to be a thin plate, as ordinarily the thickness variation of a joining assistant layer is larger than the thickness variation of a ceramic green sheet to be a thin plate, not only totaled thickness variation is increased, but also the thin plate is thickened as much as the thickness of the joining assistant layer, thus performance characteristics of the device are lowered. Contrarily, in application thereof to the latter method, the joining assistant layer can be formed on the ceramic green sheet, in a state where the ceramic green sheet is mounted on the plastic film, and as the hole can be machined after the joining assistant layer is formed, the precision of the hole is secured by the precision of the die, and the ceramic green sheet to be a thin plate is untouched whatsoever, thus high lamination reliability and high dimension precision can be compatible. Of the surface from which the plastic film is exfoliated and removed, the lamination reliability of the surface is secured by a joining assistant layer formed on a separate ceramic green sheet having a hole formed thereon to be laminated on the surface.

While the former method and the latter method have a common interest in obtaining such stability of the shape of the thin plate portions, each has respective features in fabricating processes. Therefore, a suitable method may be selected depending on the structure of a laminate or the like.

It should be noted that a ceramic green sheet mounted on a plastic film and having at least one hole formed thereon includes not only a ceramic green sheet having at least one hole formed thereon prepared by the punching or laser machining on a plastic film, but also a ceramic green sheet having at least one hole, formed in advance in a desired shape, and prepared by attaching a plastic film thereon. Further, it is preferable that the plastic film is a poly(ethylene terephthalate) film, in view of exfoliation property, mechanical strength, or the like. Furthermore, a ceramic green sheet mounting surface of the plastic film is preferably a film coated by a releasing agent containing silicone or the like as a component, with a view to improve exfoliation property of the green sheet. Further, the thickness of a ceramic green sheet on a plastic film is preferably thinner, and more preferably to be the thickness equivalent to the thickness of a green sheet for a thin plate. The reason is that by thinning the ceramic green sheet, machining precision of the ceramic green sheet per se is improved. Furthermore, in order to facilitate handling of respective green sheets, specifically the green sheet to be a thin plate, to prevent elongation and sagging, and to stabilize the shape of the thin plate portions, it is preferable that the green sheets are handled mounted on the plastic film described previously.

Specific examples of the cases where a ceramic green laminate is prepared are described hereinafter. The following examples are merely shown as illustrations and the cases where a ceramic green laminate is prepared are, of course, not limited to the examples.

LAMINATION EXAMPLE 1

Figure 19:
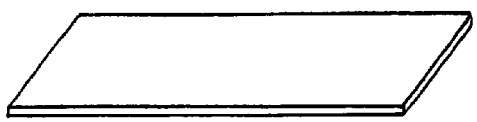
FIG. 19 shows an exemplary perspective view of examples of respective ceramic green sheets used for a laminate of ceramic green sheets when fabricating a piezoelectric/electrostrictive device of the present invention.
Figure 19:
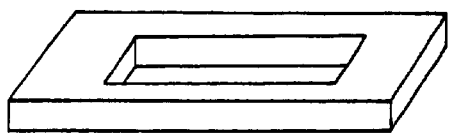
Figure 19:
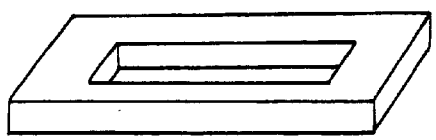
Figure 19:
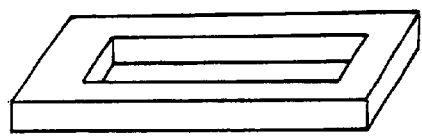
Figure 19:
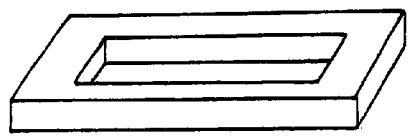
Figure 19:

After sequentially laminating a ceramic green sheet (hereinafter referred to as "GS") 1 for a thin plate, GS1 having a hole formed thereon, GS2 having a hole formed thereon, GS3 having a hole formed thereon, GS4 having a hole formed thereon, and GS2 for a thin plate, as shown in FIG. 19, an integrally laminated ceramic green body is obtained by compressing.

LAMINATION EXAMPLE 2

Step 1: After a GS1 for a thin plate is laminated with a GS1 having a hole formed thereon, an integrally laminated ceramic green body is obtained by compressing.

Step 2: After a GS4 having a hole formed thereon is laminated with a ceramic green sheet 2 for a thin plate, an integrally laminated ceramic green body is obtained by compressing.

Step 3: After sequentially laminating an integrally laminated ceramic green body obtained in step 1, GS2 having a hole formed thereon, GS3 having a hole formed thereon, and an integrally laminated ceramic green body obtained in step 2, an integrally laminated ceramic green body is obtained by compressing.

LAMINATION EXAMPLE 3

Step 1: After sequentially laminating GS1 having a hole formed thereon, GS2 having a hole formed thereon, GS3 having a hole formed thereon, and GS4 having a hole formed thereon, an integrally laminated ceramic green body is obtained by compressing.

Step 2: After sequentially laminating GS1 for a thin plate, an integrally laminated ceramic green body obtained in step 1, and GS2 for a thin plate, an integrally laminated ceramic green body is obtained by compressing.

LAMINATION EXAMPLE 4

Step 1: After laminating GS2 having a hole formed thereon with GS3 having a hole formed thereon, an integrally laminated ceramic green body is obtained by compressing.

Step 2: After sequentially laminating GS1 for a thin plate, GS1 having a hole formed thereon, an integrally laminated ceramic green body obtained in step 1, GS4 having a hole formed thereon, and GS2 for a thin plate, an integrally laminated ceramic green body is obtained by compressing.

The integrally laminated ceramic green bodies obtained in the above-described lamination examples 1 to 4 are sintered and integrally sintered bodies are obtained. However, the above-described examples are just a few of all methods of fabrication under the present invention, and the number of the compressing and the sequence for lamination and integration are specifically unlimited.

Depending on the structure, for example, the shape of a hole, the number of ceramic green sheets having a hole formed thereon, and the number of ceramic green sheets for a thin plate, or the like, the method of fabrication is suitably determined so as to attain a desired structure.

Of course, the shape of a hole is not required to be the same for all, and it is optionally determined depending on desired function. Further, the number and the thickness of respective green sheets have no specific limitation.

The above-described compressing can further improve the laminating property by heating. It is also preferable to use a joining assistant layer, as by forming a joining assistant layer with a paste, slurry, or the like mainly containing ceramic powder (preferably, of composition the same as or similar to the ceramics used in a ceramic green sheet, in view of securing reliability) and a binder, coated and printed on a ceramic green sheet, the laminating property of the green sheet interface can be improved.

Moreover, a protrusion may also be provided at a portion of the outer surface of the layer of at least one side of the outermost layer of the ceramic green laminate except for at least the thin plate portions. A device according to the present application has ordinarily piezoelectric/electrostrictive elements formed on the outer surfaces of mutually opposing thin plate portions by known means such as the screen printing method or the like, however, even when a piezoelectric/electrostrictive element is formed, for example, by the screen printing method, a surface for elements formed on the opposite surface has no chance to directly a touch stand such as a stage for printing, a setter for sintering, or the like, by the protrusion formed, thus damage to the elements can be prevented. Furthermore, by suitably selecting the height of the protrusion, the thickness of the element can be controlled. Although, the protrusion can also be formed on a sintered green laminate, namely on a ceramic laminate, it is preferable that the protrusion is formed on the green laminate to be integrally sintered, in view of stability of the structure and stability in dimension. A method of fabricating thereof is described hereunder with reference to FIGS. 14(*a*) to 14(*d*), and FIG. 15. FIG. 14(*a*) exemplarily shows a perspective view of a structure of a ceramic green laminate 108 prior to the sintering, FIG. 14(*b*) and FIG. 14(*c*) show perspective views of a structure of a ceramic laminate 109 after being sintered, and FIG. 14(*d*) exemplarily shows a structure of a ceramic green sheet having a hole formed thereon.

Figure 15:
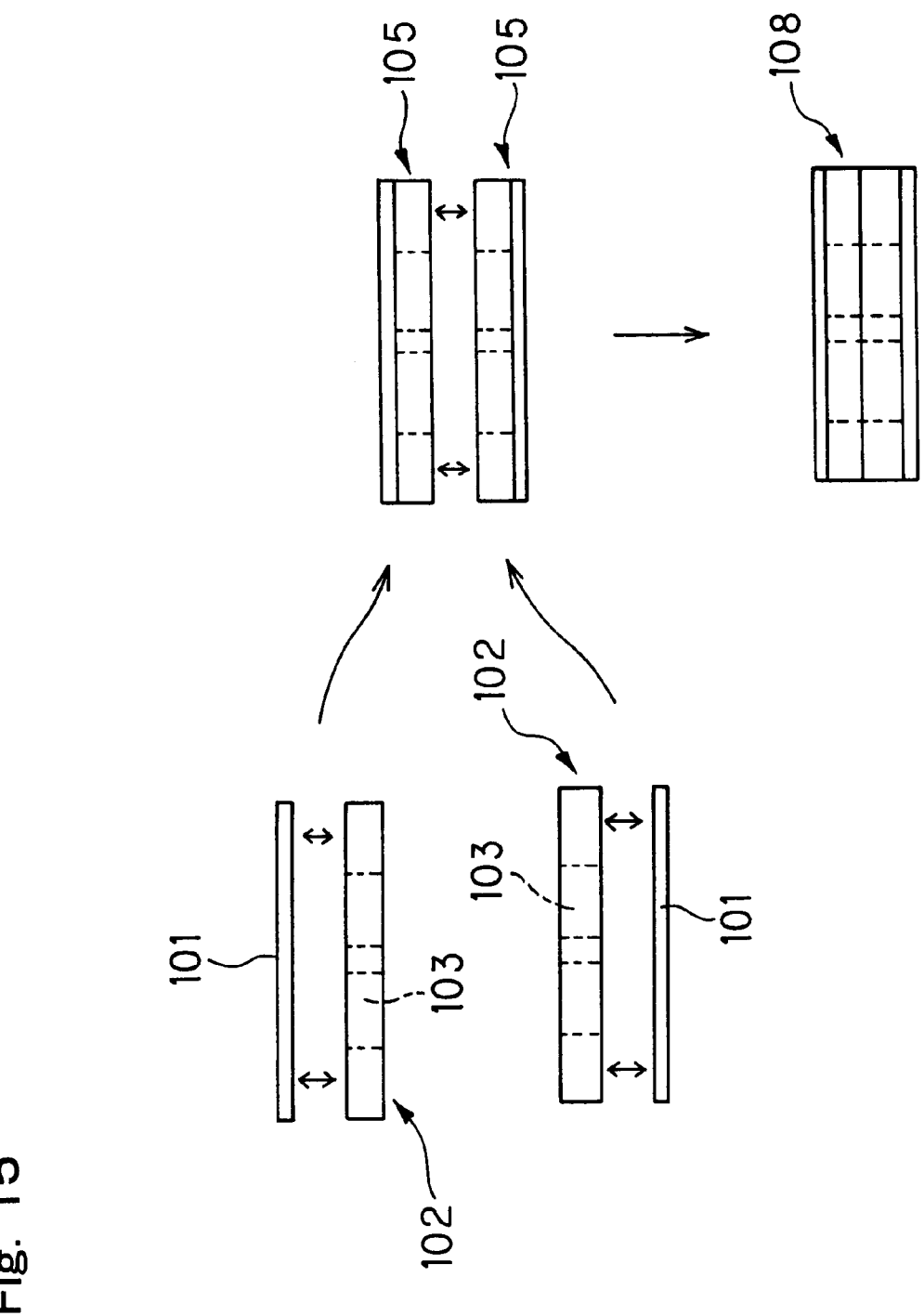
FIG. 15 shows a side view of another embodiment of a method of fabricating a piezoelectric/electrostrictive device of the present invention.

As shown in FIG. 14(*a*), a ceramic green sheet 101 to be a thin plate after being sintered, a ceramic green sheet 102 having at least one hole formed thereon, which may be composed of a plurality of sheets, and a ceramic green sheet 101 to be a thin plate after being sintered, are laminated in this sequence while positioning by use of a reference hole 104, and by integrating the laminate by way of the previously described thermo-compression joining or the like, a ceramic green laminate 108 can be obtained. When the ceramic green laminate 108 is too thick, ceramic green laminates having the thickness halved into the upper half and the lower half, as shown in FIG. 15, are formed in advance, and then by joining them so as to have the holes facing each other, a final ceramic green laminate may be obtained.

Furthermore, a ceramic green laminate 108 requires to have communicating holes 106 for communicating a portion to be a hole 103 of the ceramic green sheet 102 with the outer space formed in advance on the ceramic green sheet 102 by the punching by use of a die or the like, or the communicating holes 106 bored after a plurality the ceramic green sheets are laminated. However, so long as respective holes 103 are communicated with the outer space, the shape of the communicating holes 106 has no specific limitation, and the shape may be such as penetrating through a plurality of holes 103 as shown in FIG. 14(*a*), or such as individually communicating respective holes 103 with the outer space as shown in FIG. 14(*d*). A ceramic green laminate 108 thus integrated by one of such methods is now sintered as to be described later at a temperature around 1200 to 1600° C., however, there may be a case where a ceramic laminate 109 obtained by the sintering may have an unintended warping. In the case, it is preferable to flatten the ceramic laminate 109 by re-firing (hereinafter referred to as warping correction) with a weight placed thereon at a temperature close to the above-described sintering temperature. In this warping correction, it is preferable to use a porous ceramic plate such as a planar alumina or the like as the weight. The warping correction may be preferably performed in a step following the sintering, or by a method for flattening simultaneously with sintering with a weight placed in advance at sintering.

(2) Formation of the Piezoelectric/Electrostrictive Element

As for a piezoelectric/electrostrictive element, a desired number of piezoelectric/electrostrictive element 107 can be formed on a surface of a thin plate of a ceramic laminate 109, when a device of the present invention is fabricated, by the thick film forming method such as the screen printing method, the dipping method, the coating method, the electrophoresis method, or the like, or the thin film forming method such as the ion beam method, the sputtering method, the vacuum deposition method, the ion plating method, the chemical vapor deposition method (CVD), plating, or the like (refer FIG. 14(*b*)). However, FIG. 14(*b*) exemplarily shows a piezoelectric/electrostrictive element 107, and arrangement of the piezoelectric/electrostrictive element 107 in a device of the present application is not accurately shown. In addition, in FIG. 14(*b*) and in FIG. 14(*c*), though a thin plate 132 of the ceramic laminate 109 is denoted by solid lines, this is just to understandably describe the portion, and as the thin plate 132 is integrally sintered, without saying, such boundary is not existent. It should be noted that at least a piezoelectric/electrostrictive layer is required, to be a so-called bridging structure, in a direction in which the fixing portion is connected with the movable portion, from the fixing portion through the thin plate portion to cover at least a part of the movable portion, or from the movable portion through the thin plate portion to cover at least a part of the fixing portion, and to be formed by the above-described method such that at least one end of a piezoelectric/electrostrictive operating portion of a piezoelectric/electrostrictive element exists on the fixing portion or the movable portion, while the other end thereof is formed to position at a desired position on the thin plate portion.

By thus forming a piezoelectric/electrostrictive element by the film forming method, a piezoelectric/electrostrictive element and the thin plate portion can be integrally joined and arranged without use of an organic adhesive, such as an epoxy resin, an acrylic resin, or the like, thus securing reliability and reproducibility thereof, and facilitating integration, which is advantageous. Specifically, in a method of fabrication of the present invention, it is preferable that at least a piezoelectric/electrostrictive layer 2*a* of a piezoelectric/electrostrictive element 107 is formed by the previously described thick film forming method, and a ceramic laminate and a piezoelectric/electrostrictive element are integrated by heat treatment without use of an organic adhesive. More preferable is that a piezoelectric/electrostrictive layer not containing glass can be composed by integration by way of heat treatment, at least without adding any glass frit to the piezoelectric/electrostrictive layer, which is desirous in view of improving the displacement characteristic. The reason is that according to the methods described above, a piezoelectric/electrostrictive layer can be formed by use of a paste or a slurry, or a suspension, an emulsion, a sol, or the like containing piezoelectric ceramic particles or powder of average particle size of 0.01 to 5 $\mu$m, preferably 0.05 to 3 $\mu$m, and satisfactory piezoelectric operating characteristic is obtained. The electrophoresis method, specifically, has an advantage that a film can be formed in high density and in high shape precision. On the other hand, the screen printing method is specifically preferably employed as a method of fabricating a device according to the present invention, as film formation and pattern formation can be simultaneously performed by the method, and in addition a plurality of piezoelectric/electrostrictive elements can be formed with ease on the same ceramic laminate by the method.

Particularly, after a ceramic green laminate 108 is sintered at a predetermined condition, preferably at a temperature of 1200 to 1600° C., a first electrode is printed and sintered on a predetermined position on the surface of a thin plate 131, then a piezoelectric/electrostrictive layer is printed and sintered, and further a second electrode is printed and sintered, sequentially, thus a piezoelectric/electrostrictive element can be formed. Further, electrode leads for connecting the electrodes with driving circuits are printed and sintered. Here, if materials are selected so as to have sintering temperatures of respective members gradually to be lower, for example, platinum (Pt) for the first electrode, lead zirconate titanate (PZT) for the piezoelectric/electrostrictive layer, gold (Au) for the second electrode, and further silver (Ag) for the electrode leads, a material once sintered previously is not re-sintered at any stage, thus generation of exfoliation or aggregation of an electrode material or the like can be avoided.

At that time, at least a piezoelectric/electrostrictive layer out of a second electrode, a first electrode, and the piezoelectric/electrostrictive layer, constituting a piezoelectric/electrostrictive element is arranged extending to a part of the movable portion 4 and the fixing portion 5, and further the first electrode out of the second electrode and the first electrode may be arranged extending to a part of the movable portion 4 and the fixing portion 5. Further, the arrangement is made so as to satisfy the following expression for the length L of a piezoelectric/electrostrictive operating portion arranged on the thin plates 6 and 7, relative to the length e of the thin plates, the expression being;

$L=(50\pm40)\times e/100$, more preferably $L=(50\pm25)\times e/100$.

Furthermore, by selecting a material, respective members of a precursor (a formed body still to be sintered) of a piezoelectric/electrostrictive element 107 and electrode leads can be sequentially printed and integrally sintered at one time, while, after a piezoelectric/electrostrictive layer is formed, respective electrodes and the like can be provided at a low temperature. Further, the respective members and the electrode leads of a piezoelectric/electrostrictive element may be formed by the thin film method such as the sputtering method, the vapor deposition method, or the like, and in this case, heat treatment is not necessarily required. Moreover, it is also preferable that the precursor of the piezoelectric/electrostrictive layer 107 is formed in advance, at a position on a ceramic green laminate 108 at least finally to be the thin plate portion, and the ceramic green laminate 108 and the piezoelectric/electrostrictive element are co-fired.

When co-firing, it may be with all composing films of the precursor of the piezoelectric/electrostrictive element 107, and there may be other methods such as a method to co-fire only the first electrode and the ceramic green laminate 108, a method to co-fire composing films excepting for the second electrode and the ceramic green laminate 108, and the like. One of methods to co-fire the precursor of the piezoelectric/electrostrictive element 107 and the ceramic green laminate 108 is that a piezoelectric/electrostrictive layer is formed by the tape forming method, or the like, using a slurry material, the piezoelectric/electrostrictive layer in pre-sintering state is laminated on a predetermined portion of a ceramic green sheet 101 by the thermocompression joining, or the like, then a ceramic green sheet 102 having a hole 103 formed thereon is further laminated and compressed, and the green laminate is then co-fired so that a movable portion, a driving portion, thin plate portions, and a piezoelectric/electrostrictive layer are simultaneously fabricated. However, in this method, electrodes are to be formed in advance on the thin plates and/or the piezoelectric/electrostrictive layer by way of the previously described film forming method. Further, in addition to the method above described, electrodes and a piezoelectric/electrostrictive layer, which are respective constituting layers of a piezoelectric/electrostrictive element, are formed at positions finally (after being sintered) to be the thin plate portions of the ceramic green laminate 108 by the screen printing, and then can be co-fired. However, a method in which a piezoelectric/electrostrictive element is formed on the ceramic laminate 109, sintered in advance, by the film forming method, preferably by the screen printing method is preferably employed, as high pattern precision of an element and uniform film thickness can be obtained and strain as a structure can be made smaller.

Sintering temperatures of respective films constituting a piezoelectric/electrostrictive element are suitably determined depending upon materials constituting thereof, and generally they are between 600 and 1400° C., and preferably 1000 to 1400° C. for a piezoelectric/electrostrictive layer. In this case, in order to control the composition of the piezoelectric/electrostrictive layer, it is preferable to sinter under the presence of an evaporating source of the material of the piezoelectric/electrostrictive layer. Furthermore, when a piezoelectric/electrostrictive layer and a ceramic green laminate 108 are co-fired, sintering conditions of the both are to be matched.

Moreover, when fabricating a device having a piezoelectric/electrostrictive element formed respectively on both thin plate portions of a pair of opposing thin plate portions thereof, advantageously, a precursor of a piezoelectric/electrostrictive layer, a precursor of an electrode film, and the like are to be printed on both surfaces of the ceramic laminate 109, and in such case, it is preferable to employ a measure ① that the printing is performed on a printing stage where a cavity is formed, or ② that a frame-shaped convex is formed on a periphery of the printing position on at least one printing surface of a ceramic laminate, and the surface where the convex is formed is firstly printed, and then the other surface is printed, so that a piezoelectric/electrostrictive layer, an electrode, and the like, formed by printing, are unattached to or untouched with the printing stage. Further, specifically, when a device is structured to have a piezoelectric/electrostrictive element respectively being formed on both surfaces of a ceramic laminate in sintering the previously described piezoelectric/electrostrictive layer, it is preferable that the sintering atmosphere is made to be the same for both surfaces lest there should be any difference in the piezoelectric characteristic of the piezoelectric/electrostrictive elements on both surfaces. For example, although ordinarily a ceramic laminate having a piezoelectric/electrostrictive element (film) formed thereon is placed on a board such as a setter or the like to be sintered, in this case, gaps between setters interstacked are to be adjusted such that a space between a piezoelectric/electrostrictive layer and a setter is made to be the same for all the gaps.

(3) Cutting of the Laminated Body

A sintered laminated 132 having the above-described piezoelectric/electrostrictive element formed thereon is, after the piezoelectric/electrostrictive element and electrode leads are subjected to coating, shielding, or the like, are cut in a laminating direction of a ceramic green sheet so as to have a rectangular hole 133 apertured on a side of the laminate, thus a plurality of devices can be simultaneously obtained (FIG. 14(*c*)). As a method for cutting, in addition to the dicing machining, the wire-saw machining, or the like (mechanical machining), the laser machining by way of the YAG laser, the excimer laser, or the like, and the electron beam machining may also be applied. When the sintered laminate is cut into respective desired units, it is preferable to have the cut bodies subjected to heating treatment at 300 to 800° C. The reason is that, though a defect such as a micro-crack or the like is likely to occur inside the laminate by the machining, the defect can be removed by the heat treatment, thus improving reliability. Further, it is also preferable to have the cut bodies subjected to aging process by leaving at a temperature of around 80° C. for about 10 hours after the above-described heat treatment. By this treatment, a variety of stress or the like suffered during the process of fabrication is mitigated, contributing to improvement of the characteristic.

When fabricating a device of the present invention, cutting is performed such that a hole of the desired shape, for example, a rectangular hole 133, is apertured on a side of the laminate. Such cutting is advantageous in that not only a plurality of devices are separated, but also the thin plate portions and a hole of a device (in case of the device 1 shown in FIG. 5, the thin plate portions 6 and 7, and the hole 8) can be simultaneously formed, and it is preferable in that a complicated structure, which is difficult to be fabricated as two or more rectangular solids are to be coupled by a thin plate, can be conveniently obtained.

Further, by suitably changing the number of formation or the position of formation of a hole 103 in a ceramic green sheet 102, or a cutting position of a sintered laminate body 132 having a piezoelectric/electrostrictive element 107 formed thereon, a device having a plurality of driving portions or a device having a driving portion of different lengths can be formed with extreme ease. Further, by simultaneously cutting a ceramic laminate 109 and a piezoelectric/electrostrictive element 107, a device having the thin plate portion and a piezoelectric/electrostrictive element in the same width can be fabricated with ease, which is preferable. Although, such cutting can be performed with the green state prior to sintering, it is preferable to perform with a sintered body in order that dimension precision is increased and release of ceramic particles from respective members is prevented.

Moreover, a device of the present invention can be fabricated by use of not only the above-described methods of fabrication by way of a ceramic green sheet, but also the press molding method using a molding die or the casting method, the injection molding method, the photolithography, or the like. Further, though there can also be a method to fabricate the device by joining respective members which are separately prepared, the method is problematical also in reliability in addition to low productivity as a joined portion thereof is likely to have a fracture or the like.

4. Application Example of the Device

Figure 16A:
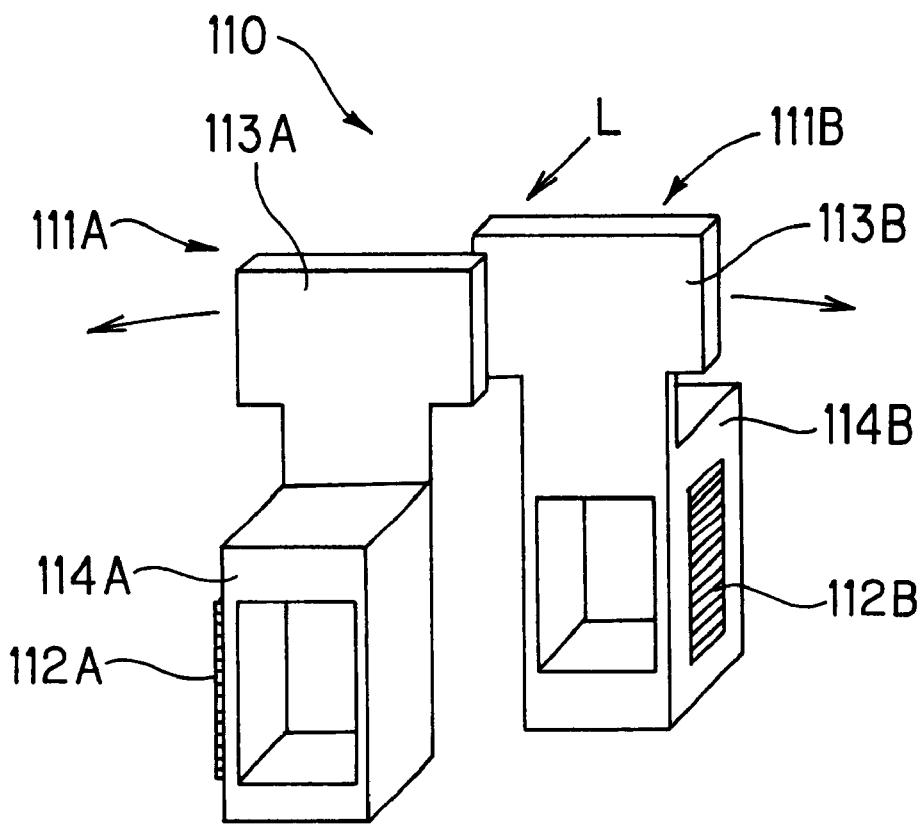
FIGS. 16($a$) and ($b$) show schematic explanatory views of an embodiment of an optical shutter of the present invention, and FIG. 16($a$) shows a perspective view and FIG. 16($b$) shows a top view thereof.
Figure 16B:
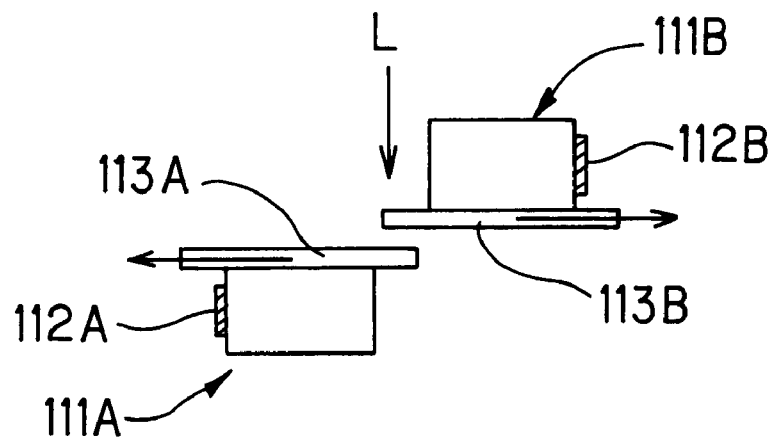

Lastly, as an application example of a device of the present invention, an example where a device of the present invention is applied to a displacement element for an optical shutter is described with reference to drawings. FIGS. 16(*a*) and (*b*) and FIGS. 17(*a*), (*b*), and (*c*) exemplarily show examples where devices of the present invention are applied to displacement elements for optical shutters, and it can be easily understood that they do not accurately represent the structure according to the present application. By the way, "optical shutter" in the present application means a functional element for controlling transmission and shielding of the light, by relatively moving two shielding plates, and it can be functioned as an optical switch or an optical diaphragm, as it can perform ON/OFF control of the light and control of the light quantity.

When a device of the present invention is mounted on an optical shutter, at least one shielding plate out of the two shielding plates is mounted on the movable portion of the device of the present invention.

For example, an optical shutter 110 shown in FIGS. 16(*a*) and (*b*) comprises two units 111A and 111B respectively provided with a device of the present invention and a shielding plate, and two shielding plates 113A and 113B are fixed on the movable portions 114A and 114B of respective devices, and arranged to have mutual planar surfaces to be parallel, and respectively a part of the planar surfaces being overlapped toward the incident direction of the light L.

Although the optical shutter 110 shields the light L in a state shown in FIG. 16(*a*), by applying voltages of the same phase across a piezoelectric/electrostrictive elements 112A and 112B formed on the driving portion of the device, the optical shutter 110 is capable of performing ON/OFF control of the light and control of the light quantity, as the shielding plate 113A moves toward the left-hand side in FIG. 16(*a*), and the shielding plate 113B moves toward the right-hand side in FIG. 16(*a*), to have the overlapping condition of the shielding plates 113A and 113B changed.

Figure 17A:
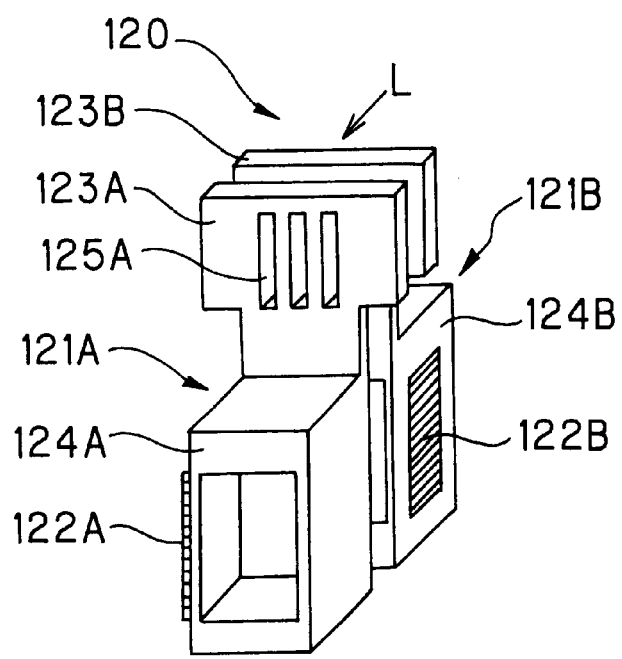
FIGS. 17($a$), ($b$), and ($c$) show schematic explanatory views of another embodiment of an optical shutter of the present invention, and FIG. 17($a$) shows a perspective view thereof, FIG. 17($b$) shows a top view thereof, and FIG. 17($c$) shows an enlarged view of shields.
Figure 17C:
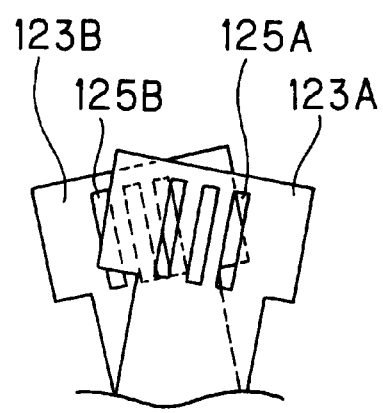
Figure 17B:
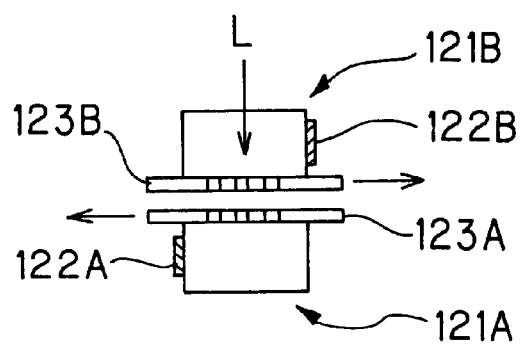

Further, an optical shutter 120 shown in FIG. 17(*a*) comprises two units 121A and 121B respectively provided with a device of the present invention and a shielding plate, and two shielding plates 123A and 123B are fixed on the movable portions 124A and 124B of respective devices, and arranged to have mutual planar surfaces to be parallel, and the entirety of the planar surfaces are overlapped toward the incident direction of the light L. And in positions respectively opposing to the shielding plates 123A and 123B, slits 125A and 125B are respectively formed.

Whereas the optical shutter 120 transmits the light L through the slits 125A and 125B in the state shown in FIGS. 17(*a*) and (*b*), by applying voltages of the same phase across piezoelectric/electrostrictive elements 122A and 122B formed on the driving portion of the device, the optical shutter 120 can perform ON/OFF control of the light and control of the light quantity, as the shielding plate 123A moves toward the left-hand side in FIG. 17(*b*), and the shielding plate 123B moves toward the right-hand side in FIG. 17(*b*), to have the overlapping condition of the slits 125A and 125B changed. Whereas a state where a part of the light is transmitted is shown in FIG. 17(*c*), by changing the shape and the position of formation of the slits 123A and 123B, it is possible to completely shield the light L.

Contrarily, in a state shown in FIGS. 17(*a*) and (*b*), the slits 125A and 125B may be structured not to overlap to shield the light L, and the slits 125A and 125B may be structured to overlap to transmit the light L by the movement of the shields 123A and 123B. Though examples shown in FIGS. 16(*a*) and (*b*), and FIGS. 17(*a*), (*b*) and 17(*c*) shows examples where two shielding plates are fixed to respective devices, an optical shutter of the present invention can control transmission and shielding of the light only by having at least one shielding plate fixed on the device, and at least the one shielding plate moved. However, the case where both shielding plates are fixed on the device is preferable, as relative moving quantity of the shielding plates can be increased. Whereas the examples shown in FIGS. 16(*a*) and (*b*), and FIGS. 17(*a*), (*b*) and (*c*) have respective optical shutters comprising two units, an optical shutter may comprise three or more units. In this case, by providing a variety of moving directions for a plurality of shielding plates, the optical shutter may be used as an optical diaphragm or the like having varied degrees of aperture of the overlapped parts. An optical shutter of the present invention is suppressed of operation in the flapped direction of a shielding plates as the shielding plate is fixed on the movable portion of a device of the present invention. In other words, as a shielding plate always moves straight to the incident direction of the light, the optical shutter can be preferably used in that ON/OFF control of the light and control of the quantity of light can be made possible in improved precision.

A device according to the present invention has a feature of having high rigidity in the width direction of the thin plate portion, namely in the Y-axis direction, thus is a structure where rigid joining is possible when functional parts such as a sensor, a magnetic head, and the like, are fixed to the present device, and further when the present device per se is fixed to another structure. In addition, because of the rigidity, the device also has a feature that a part of relatively larger mass can be fixed thereon.

Moreover, in the above-described thin plate portions, in comparison with the width direction, the thickness direction has relatively smaller rigidity, thus an advantage is displayed that a component in the Y-axis direction, namely the flapped component, can be effectively suppressed as a displacement component when the device is operated, based on the directional property of the rigidity.

Further, as a device according to the present invention is structured such that one end of a piezoelectric/electrostrictive operating portion exists on a fixing portion or a movable portion, and the other end thereof exists on the thin plate portions, and at least a piezoelectric/electrostrictive layer extends over the movable portion and the fixing portion, a displacement of a piezoelectric/electrostrictive element develops using joined portions of the fixing portion with the thin plate portions as the fulcrums, or joined portions of the movable portion with the thin plate portions as the fulcrums. Further, as the mechanism of the displacement is of a mode in which the thin plate portions are bent and displaced so as to have the joined portions of the movable portion with the thin plate portions to largely displace toward the outer space, it is possible to displace the movable portion in still larger magnitude.

Further, by making the length of a piezoelectric/electrostrictive operating portion disposed on the thin plate portions to be 10 to 90% of the length of the thin plate portions, driving efficiency of the driving portion can be increased, thus a feature that the movable portion can be largely displaced with a low driving voltage is displayed.

In addition, from an effect that the joined portions of the movable portion with the thin plate portions have at least piezoelectric/electrostrictive layers in addition to the thin plate portions existing thereon, and an effect that a base portion comprising a movable portion, thin plate portions, and a fixing portion is an integrated body fabricated by co-firing sintering, and a piezoelectric/electrostrictive element is also integrated with the thin plate portions by heat treatment without using any adhesive, any of respective joined portions being not adhered to be incorporated, and therefore, mechanical rigidity is high at the joined portions, and higher resonant frequency of a structure is realized. As the result, in addition to a feature that the movable portion can be displaced largely and in a high speed, the device now has another feature that variation in the characteristic is small for an elongated usage, as the joined state of the joined portions is highly reliable.

As has been described, a device according to the present invention is structurally and functionally completely different, for example, from the actuator disclosed in JP-A-64-64640, and the device is said to be highly reliable.

Accordingly, the device according to the present invention can be used not only as active elements such as a variety of transducers, a variety of actuators, frequency regional functional parts (filters), transformers, vibrators and resonators for communication and power uses, oscillators, discriminators, and the like, but also as sensor elements for a variety of sensors, such as ultra-sonic sensors and acceleration sensors, angular velocity sensors and impact sensors, mass sensors, and the like, and specifically, the device can be preferably used for a variety of actuators for mechanisms for displacement, positioning adjustment and angular adjustment of a variety of precision parts, and the like, of optical apparatuses, precision apparatuses, and the like.

What is claimed is:

1. A piezoelectric/electrostrictive device comprising a driving portion to be driven by displacement of a piezoelectric/electrostrictive element, a movable portion to be operated by driving said driving portion, a fixing portion for holding said driving portion and said movable portion, said movable portion being coupled with said fixing portion via said driving portion, and a hole formed by inner walls of said driving portion, an inner wall of said movable portion, and an inner wall of said fixing portion;

the piezoelectric/electrostrictive device being characterized in that the driving portion comprises (i) a pair of mutually opposing thin plate portions, and (ii) a piezoelectric/electrostrictive element including a piezoelectric/electrostrictive operating portion comprising a pair or more of electrodes and a piezoelectric/electrostrictive layer formed on at least a part of the outer surface of at least one of said thin plate portions, wherein one end of said piezoelectric/electrostrictive operating portion, in a direction in which said fixing portion is connected with the movable portion, exists only on said fixing portion or said movable portion and the other end of said piezoelectric/electrostrictive operating portion is arranged on said one of said thin plate portions, and at least said piezoelectric/electrostrictive layer of said piezoelectric/electrostrictive element extends over said movable portion and said fixing portion.

2. A piezoelectric/electrostrictive device according to claim 1, wherein said moveable portion, said thin plate portions, and said fixing portion are integrally formed by co-firing a ceramic green sheet laminate.

3. A piezoelectric/electrostrictive device according to claim 1, wherein said piezoelectric/electrostrictive element is a film-like piezoelectric/electrostrictive element which is first formed directly on said one of said thin plate portions, and said movable portion or said fixing portion, and then integrally formed therewith by sintering.

4. A piezoelectric/electrostrictive device according to claim 3, wherein said piezoelectric/electrostrictive layer does not contain glass frit.

5. A piezoelectric/electrostrictive device according to claim 1 wherein a length L of that portion of said piezoelectric/electrostrictive operating portion disposed on said one of said thin plate portions satisfies, in relation with a length e of said one of said thin plate portions, the following expression:

$$L=(50\pm40)\times e/100.$$

6. A piezoelectric/electrostrictive device according to claim 1, wherein a length L of that portion of said piezoelectric/electrostrictive operating portion disposed on said one of said thin plate portions satisfies, in relation with a length e of said one of said thin plate portions, the following expression:

$$L=(50\pm25)\times e/100.$$

7. A piezoelectric/electrostrictive device according to claim 1, wherein said piezoelectric/electrostrictive element has a multi-layered piezoelectric/electrostrictive operating portion.

8. A piezoelectric/electrostrictive device according to claim 1, wherein said piezoelectric/electrostrictive element includes only a single pair of electrodes operatively associated with said piezoelectric/electrostrictive layer.

9. A piezoelectric/electrostrictive device according to claim 1, wherein said movable portion is coupled with said fixing portion via said driving portion along a length direction of said device, said hole has a central axis that extends in an axial direction substantially parallel to said thin plate portions and substantially perpendicular to said length direction, and wherein said device is free of any other holes extending in any direction other than said axial direction.

10. A piezoelectric/electrostrictive device according to claim 1, wherein one end of at least one electrode of said pair of electrodes exists only on said fixing portion or said movable portion and the other end thereof extends over said one of said thin plate portions.

* * * * *